(12) United States Patent
Jiang et al.

(10) Patent No.: US 11,335,608 B2
(45) Date of Patent: May 17, 2022

(54) ELECTRON BEAM SYSTEM FOR INSPECTION AND REVIEW OF 3D DEVICES

(71) Applicant: KLA Corporation, Milpitas, CA (US)

(72) Inventors: Xinrong Jiang, Palo Alto, CA (US); Christopher Sears, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/224,407

(22) Filed: Apr. 7, 2021

(65) Prior Publication Data

US 2021/0327770 A1 Oct. 21, 2021

Related U.S. Application Data

(60) Provisional application No. 63/010,097, filed on Apr. 15, 2020.

(51) Int. Cl.
*H01J 37/00* (2006.01)
*H01L 21/66* (2006.01)
*H01J 37/063* (2006.01)
*H01J 37/065* (2006.01)
*H01J 37/244* (2006.01)
*H01J 37/14* (2006.01)

(52) U.S. Cl.
CPC ............ *H01L 22/12* (2013.01); *H01J 37/063* (2013.01); *H01J 37/065* (2013.01); *H01J 37/14* (2013.01); *H01J 37/244* (2013.01); *H01J 2237/141* (2013.01); *H01J 2237/152* (2013.01)

(58) Field of Classification Search
CPC ..................................... H01L 22/12
USPC ......................................... 250/397
See application file for complete search history.

(56) References Cited

U.S. PATENT DOCUMENTS

| 5,854,490 | A | * | 12/1998 | Ooaeh | H01J 37/241 |
| | | | | | 250/492.23 |
| 6,885,728 | B2 | * | 4/2005 | Hadland | H01J 35/045 |
| | | | | | 378/109 |
| 8,946,631 | B2 | | 2/2015 | Noji et al. | |
| 9,251,990 | B2 | * | 2/2016 | Kobayashi | H01J 9/04 |
| 9,390,886 | B2 | | 7/2016 | Nakasuji et al. | |
| 9,601,303 | B2 | | 3/2017 | Frosien | |
| 9,852,881 | B2 | | 12/2017 | Shishido et al. | |

(Continued)

FOREIGN PATENT DOCUMENTS

| JP | 2009110971 A | 5/2009 |
| JP | 2014507051 A | 3/2014 |

(Continued)

OTHER PUBLICATIONS

Hitachi High-Tech, "Hitachi High-Technologies to Launch Advanced Voltage CD-SEM 'CV6300 Series,'" Jul. 2, 2019.

(Continued)

*Primary Examiner* — Phillip A Johnston
(74) *Attorney, Agent, or Firm* — Hodgson Russ LLP

(57) ABSTRACT

An electron beam system for wafer inspection and review of 3D devices provides a depth of focus up to 20 microns. To inspect and review wafer surfaces or sub-micron-below surface defects with low landing energies in hundreds to thousands of electron Volts, a Wien-filter-free beam splitting optics with three magnetic deflectors can be used with an energy-boosting upper Wehnelt electrode to reduce spherical and chromatic aberration coefficients of the objective lens.

20 Claims, 17 Drawing Sheets

(56) References Cited

U.S. PATENT DOCUMENTS

| | | | |
|---|---|---|---|
| 10,352,695 B2 | 7/2019 | Dziura et al. | |
| 10,573,481 B1 * | 2/2020 | Katsap | H01J 1/148 |
| 10,823,683 B1 | 11/2020 | Nie et al. | |
| 10,998,162 B2 * | 5/2021 | Miyamoto | H01J 37/3174 |
| 2001/0025929 A1 | 10/2001 | Nakasuji | |
| 2009/0179151 A1 | 7/2009 | Cheng et al. | |
| 2016/0123905 A1 | 5/2016 | Liao et al. | |
| 2016/0163502 A1 | 6/2016 | Li | |
| 2020/0211818 A1 | 7/2020 | Yin et al. | |
| 2020/0373120 A1 | 11/2020 | Yuli et al. | |

FOREIGN PATENT DOCUMENTS

| | | |
|---|---|---|
| WO | 2014142745 A1 | 9/2014 |
| WO | 2016152582 A1 | 9/2016 |
| WO | 2020136094 A2 | 7/2020 |

OTHER PUBLICATIONS

Sun et al., "High-voltage CD-SEM-based application to monitor 3D profile of high-aspect-ratio features," J. of Micro/Nanolithography, MEMS, and MOEMS, 2020, 19(2), 024002.

Oberai & Yuan, "Smart E-Beam for Defect Identification & Analysis in the Nanoscale Technology Nodes: Technical Perspectives," Electronics, 2017, 6, 87.

WIPO, ISR for International Application No. PCT/US2021/026945, dated Aug. 6, 2021.

* cited by examiner

ELECTRON BEAM SYSTEM FOR INSPECTION AND REVIEW OF 3D DEVICES

CROSS-REFERENCE TO RELATED APPLICATIONS

This application claims priority to the provisional patent application filed Apr. 15, 2020 and assigned U.S. App. No. 63/010,097, the disclosure of which is hereby incorporated by reference.

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

A focused electron beam system is commonly used to create or examine the microstructure of articles, such as a silicon wafer used in the fabrication of integrated circuits. The electron beam is formed with electrons that are emitted from an emitter in an electron gun, which acts as a fine probe when it interacts with the wafer to examine microstructures.

The 2D planar processes of nano-fabrications are facing bottlenecks when trying to meet the development of semiconductor chips because of physical effects that occur with the increase of the IC integration density. 3D stereoscopic processes of chip fabrications have been developed to address the drawback of the 2D processes. An important development in 3D nano-fabrication processes is the design and fabrication of 3D NAND flash memory. FIG. 1 shows the schematic of a 3D NAND flash memory. FIG. 2 is the cross-section view of FIG. 1, serving as a model of stacked bits and memory holes in a 3D NAND flash memory device. A 3D NAND flash device includes many stacked thin films (e.g., Si and $SiO_2$ thin films) formed on a substrate and memory holes (or channel holes). A Si film together with a $SiO_2$ film forms a layer of a NAND device, and a layer of the stacked films together with a memory hole form a bit of a NAND flash. A 96-layer NAND flash is now in market, and a 128-layer and up to 256-layer NAND flash devices are expected to be on market in the near future.

A 96-layer NAND requires 192 Si and $SiO_2$ thin films. A commonly-used 8 GB NAND flash requires about 83 million memory holes (8e9/96=8.3e7). Looking at a complete wafer, there will be hundreds of billions of memory holes. All these memory holes are generated with nano etching technologies, as shown in FIG. 2. A good etching result should form the memory hole like that of (c) in FIG. 2. However, high uniformity etching results for hundreds of billions of memory holes with hundreds of layers of depth does not always occur due to technology limits. For instance, some memory holes may be over-etched or under-etched like in (a) and (b) of FIG. 2. Other memory holes may be etched and leave a defect or tilt-etched like (d) or (e) in FIG. 2, respectively. Accordingly, electron beam wafer inspection and review of these hundreds of billions of memory holes may be needed to develop 3D NAND flash memories.

FIG. 3 shows the model of using a focused electron beam to inspect a 3D NAND memory hole. The memory holes with a 3D NAND flash are characterized by an extremely high aspect ratio (AR). The AR is defined as the ratio of the hole diameter, D, to the depth of the hole, H. For example, AR=1:200 if D=0.1 μm and H=20 μm, meaning that the thickness of each thin film is only 0.1 μm for a 100-layer NAND flash.

Optically speaking, an extremely high AR means a large depth of focus (DOF) with an electron beam system used to perform wafer inspections and reviews. As shown in FIG. 3, to dump all the electrons of the beam onto the bottom of the memory hole, the DOF of the focused electron beam may need to be greater than 20 μm for meeting the example with an AR of 1:200. In other words, if the d(z) in FIG. 3 is an electron beam spot size from the top to bottom of the memory hole, the d(z) should be less than D in all the full depth of H.

An electron beam system with tens of microns of DOF is difficult to design and implement. However, for the wafer inspection, review, and critical dimension (CD) measurement, a large DOF electron beam system can be used not only in 3D NAND flashes but also in 3D dynamic random-access memory (DRAM) electronics as well as all other high aspect ratio (HAR) devices (e.g., deep trench logic devices, etc.).

Photon beams are not typically used to inspect and review a HAR device, because the numerical aperture (NA) in a focused photon beam is fairly large (e.g., up to tens of degrees). The NA is equal to the beam half angle $\beta$ in FIG. 3. The DOF of a focused beam is inversely proportional to the NA, making the photon beam DOF quite short.

Electron beam systems have used secondary electrons (SE) as signal to perform and/or complete wafer inspections, reviews, and CD measurements. However, the secondary electron signals can only reflect the characteristics from the surface of materials. The secondary electrons are unable to escape from the bottom of an HAR memory hole because of their low energies (e.g., several electron Volts) and large emission polar angles to which they are stopped by the wall of the memory holes.

Electron beam systems also have used back-scatted electrons (BSE) as signal to inspect and review the bottom of a contact hole in a DRAM with relatively high AR or a memory hole with tens of layers of stacked thin films, as shown in FIG. 4. In FIG. 4, the electrons of the primary beam with a landing energy (LE) normally in a range of approximately 1 keV to 20 keV bombard the bottom of a memory hole. BSEs with the same energy as the landing energy are generated to penetrate the stacked thin film materials and escape from the top surface of the materials due to their relatively high energies and large emission polar angles. The BSEs that escape from the stacked thin film materials through the penetration may be collected by one or more detectors deployed in the electron beam optical column above the wafer.

Previous electron beam systems with BSE signals used to inspect and/or review an HAR device have drawbacks. First, these systems have limited applications. The electron beam voltage (or the beam energy) is normally limited below 35 kV or below 25 kV, or the electron beam landing energy onto the wafer is normally limited below 30 keV. Accordingly, the BSE energy is normally limited below 30 keV too. Thus, the stacked thin film materials cannot be too thick or the BSEs will be insufficiently powered to penetrate out of the bulk of the materials. This limits such electron beam systems to inspection and review of tens of layers of a 3D NAND flash device. To inspect and review hundreds of layers of a 3D NAND flash device, an electron beam landing energy of up to approximately 50 keV to 100 keV may be needed.

Second, previous electron beam systems with BSE signals have limited DOF of the primary electron beam. To increase the DOF, a small NA of the focused electron beam can be used (i.e., the beam half angle $\beta$ in FIG. 3). A system with lower beam energies or lower landing energies has multiple disadvantages. The optical blurs caused by the Coulomb interactions between primary electrons become dominant because the electron density becomes higher when the electron beam becomes narrower for smaller NA. The electron gun lens aberrations are more magnified to the image side of the optics due to a smaller NA or larger optical magnification, thereby degrading the combined resolution at wafer. The gun lens aberrations can become even more dominant over the objective lens aberrations for a small NA optics if the gun lens is an electrostatic lens.

Through Monte Carlo simulations of a commercially available electron beam system with 10 kV beam voltage and 9 keV landing energy, FIGS. 5(a) and 5(b) show how the application of the electron beam system are limited. The primary electrons are widely distributed with long tails in x and y directions. Even for a large 0.3×0.3 μm memory hole, only 95% and 97% electrons (the percentage displayed in FIG. 5(a)) may be included at the hole top with z=−3.5 μm (FIG. 5(a)) and bottom with z=4.5 μm (FIG. 5(b)), respectively, meaning the aspect ratio is only AR=0.3:8.0=1:27. If the hole size is narrowed to 0.1×0.1 μm, the aspect ratio is raised to AR=1:81, but many of the outer electrons would be stopped at the top rim of the memory hole. These outer electrons will generate BSEs and pollute the BSE signal from the bottom of the memory hole.

The BSE yield is normally much lower than SE yield. To have sufficient ratio of signal to noise, the beam current may be raised in the primary electron beam. However, the Coulomb interactions between electrons may be fairly sensitive to the beam current, causing the tails of the electron distributions to increase rapidly and further pollute the usual signal from the bottom of a memory hole.

Therefore, improved systems and methods for generating an electron beam are needed.

BRIEF SUMMARY OF THE DISCLOSURE

A system is provided in a first embodiment. The system includes an electron beam source that generates an electron beam; a beam-limiting aperture disposed in a path of the electron beam; a lower Wehnelt electrode disposed in the path of the electron beam; an upper Wehnelt electrode disposed in the path of the electron beam between the lower Wehnelt electrode and the beam-limiting aperture; an annular detector disposed on a surface of the upper Wehnelt electrode facing the lower Wehnelt electrode; a magnetic condenser lens disposed in the path of the electron beam between the upper Wehnelt electrode and the beam-limiting aperture; a deflector disposed in the path of the electron beam between the upper Wehnelt electrode and the condenser lens; a magnetic objective lens coil disposed in the path of the electron beam between the deflector and the upper Wehnelt electrode; and a ground tube disposed in the path of the electron beam. The magnetic condenser lens includes pole pieces and a condenser lens coil. The magnetic objective lens coil is disposed around the ground tube.

The system can include an aperture disposed in the path of the electron beam between the condenser lens and the beam-limiting aperture.

The electron beam source can include a tip with a radius less than 1 μm.

The deflector can be a magnetic deflector or a Wien filter. In an embodiment, the deflector is a magnetic deflector. The system can further include an upper magnetic deflector and a middle magnetic deflector. The upper magnetic deflector is disposed in the path of the electron beam between the deflector and the magnetic condenser lens. The middle magnetic deflector is disposed in the path of the electron beam between the upper magnetic deflector and the magnetic deflector.

The upper magnetic deflector can be configured to deflect the electron beam to the middle magnetic deflector. The middle magnetic deflector can be configured to deflect the electron beam toward the magnetic deflector in a direction opposite that of the upper magnetic deflector. The magnetic deflector can be configured to deflect the electron beam and collimate the electron beam along the path into the ground tube.

Each of the magnetic deflector, the upper magnetic deflector, and the middle magnetic deflector can have eight magnetic pole pieces that are rotationally symmetric.

The system can include a side detector disposed between the middle magnetic deflector and the magnetic deflector. The side detector can be configured to collect at least secondary electrons.

The system can further include an electron beam bender disposed between the middle magnetic deflector and the magnetic deflector. The electron beam bender can be configured to filter between the secondary electrons from the back scattered electrons at the side detector.

A method is provided in a second embodiment. The method includes generating an electron beam with an electron beam source. The electron beam is directed through a beam-limiting aperture. The electron beam is directed through a magnetic condenser lens disposed along a path of the electron beam downstream of the beam-limiting aperture. The electron beam is directed through a deflector disposed along a path of the electron beam downstream of the magnetic condenser lens. The electron beam is directed through an objective lens, wherein the objective lens includes a ground tube, an upper Wehnelt electrode, and a lower Wehnelt electrode. The electron beam is directed from the lower Wehnelt electrode at a surface of a wafer. Backscattered electrons from the wafer are received at an annular detector disposed on a surface of the upper Wehnelt electrode. The surface of the upper Wehnelt electrode faces the lower Wehnelt electrode.

In an instance, a beam voltage of the electron beam is from 50 kV to 100 kV and has a landing energy from 50 keV to 100 keV.

The magnetic condenser lens can be configured to form the electron beam to have a small depth of focus mode and a large depth of focus mode. A numeric aperture can be smaller for the large depth of focus mode than the small depth of focus mode.

The wafer can include a three-dimensional semiconductor structure.

In an instance, a depth of focus for the electron beam is up to 20 μm.

The electron beam source can include a tip with a radius less than 1 μm.

The deflector can be a magnetic deflector or a Wien filter. In an instance, the deflector is a magnetic deflector. The method can further include directing the electron beam through an upper magnetic deflector and a middle magnetic deflector disposed along the path of the electron beam between the deflector and the magnetic condenser lens.

The upper magnetic deflector can be configured to deflect the electron beam to the middle magnetic deflector. The middle magnetic deflector can be configured to deflect the electron beam toward the magnetic deflector in a direction opposite that of the upper magnetic deflector. The magnetic deflector can be configured to deflect the electron beam and collimate the electron beam along the path into the ground tube.

The method can include receiving secondary electrons at a side detector disposed between the middle magnetic deflector and the magnetic deflector.

The method can include bending electrons returned from the wafer between the middle magnetic deflector and the magnetic deflector thereby filtering between the secondary electrons from the back scattered electrons at the side detector.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

3D stereoscopic processes of chip nano-fabrications are developing as more drawbacks of 2D planar processes of nano-technologies are encountered. A large number of chip devices like 3D NAND flash, 3D DRAM, and 3D logic are configured with memory holes, channel holes, staircase steps, and deep trenches which may need to be inspected and reviewed during fabrication. For example, there are hundreds of billions of memory holes in depths of tens of microns in a wafer for a 96-layer 3D NAND flash.

Embodiments disclosed herein can provide a DOF of tens of microns for high AR structures in 3D chip devices (e.g., AR=1:100 and beyond). These embodiments can provide a 20 µm DOF in a 60 kV electron beam system that meets AR=1:200 wafer inspections and reviews. These embodiments also can provide a high resolution system for wafer surface inspections and reviews that form SE and BSE images simultaneously.

To address the drawbacks of previous systems, an electron beam system can be constructed to provide high resolutions, narrow electron distribution tails, and provide large DOF for the inspection and review of high AR electronic devices. The beam voltage (BV) can be raised to approximately 50 kV to 100 kV, which can be adjustable, and can allow the electron landing energy up to approximately 50 keV to 100 keV. The mechanical design can avoid high voltage (HV) arcing. Given a group of beam voltage and landing energy, the beam current may be increased to generate more BSEs and increase throughput and ratio of signal to noise. The highest beam current can be selected by limiting the outer electrons bombarding onto both the top and bottom rims of a memory hole to be less than, for example, 2% of total primary electrons.

Figure 6A:
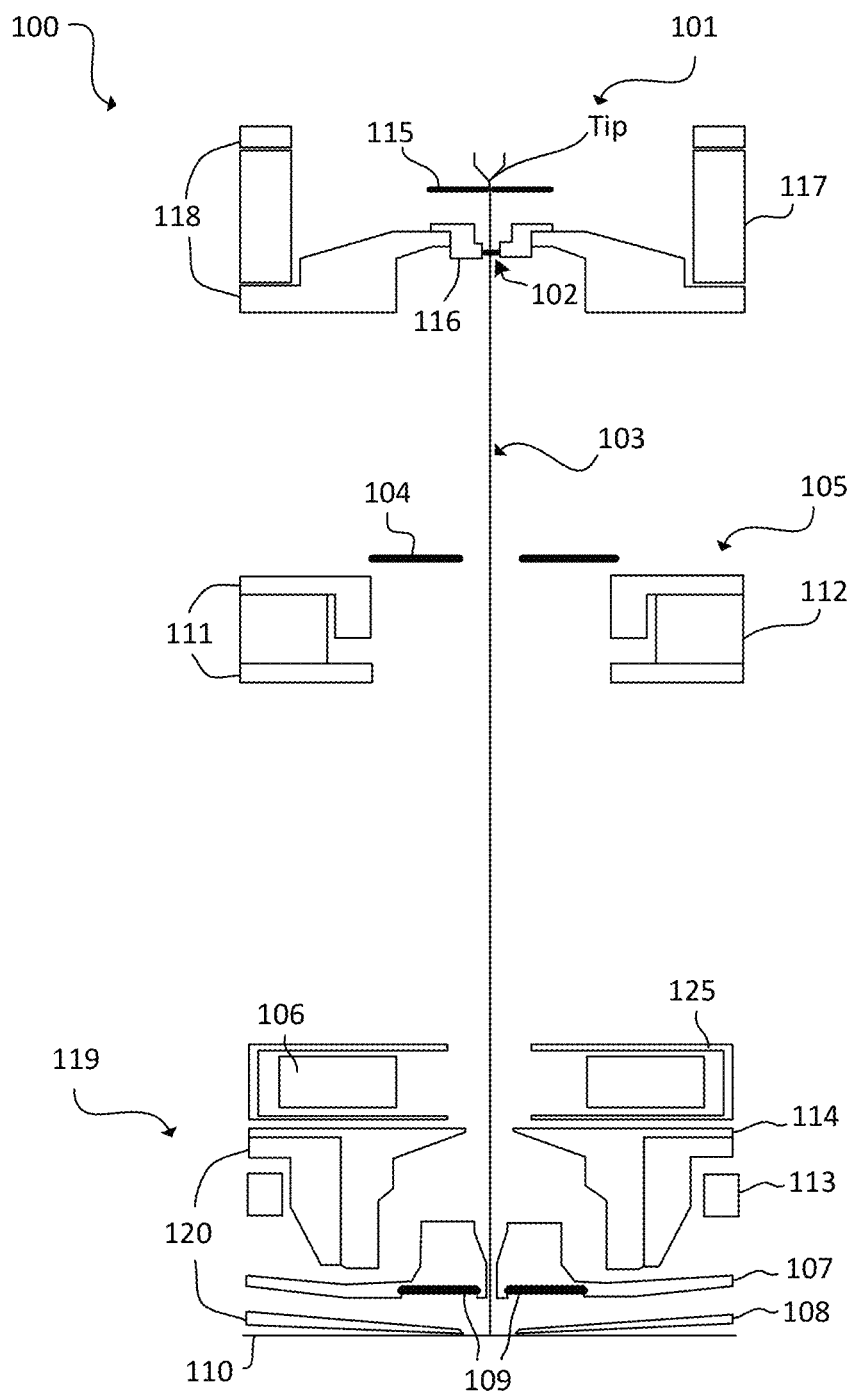
FIG. 6(a) is a first embodiment of an electron beam system.
Figure 6B:
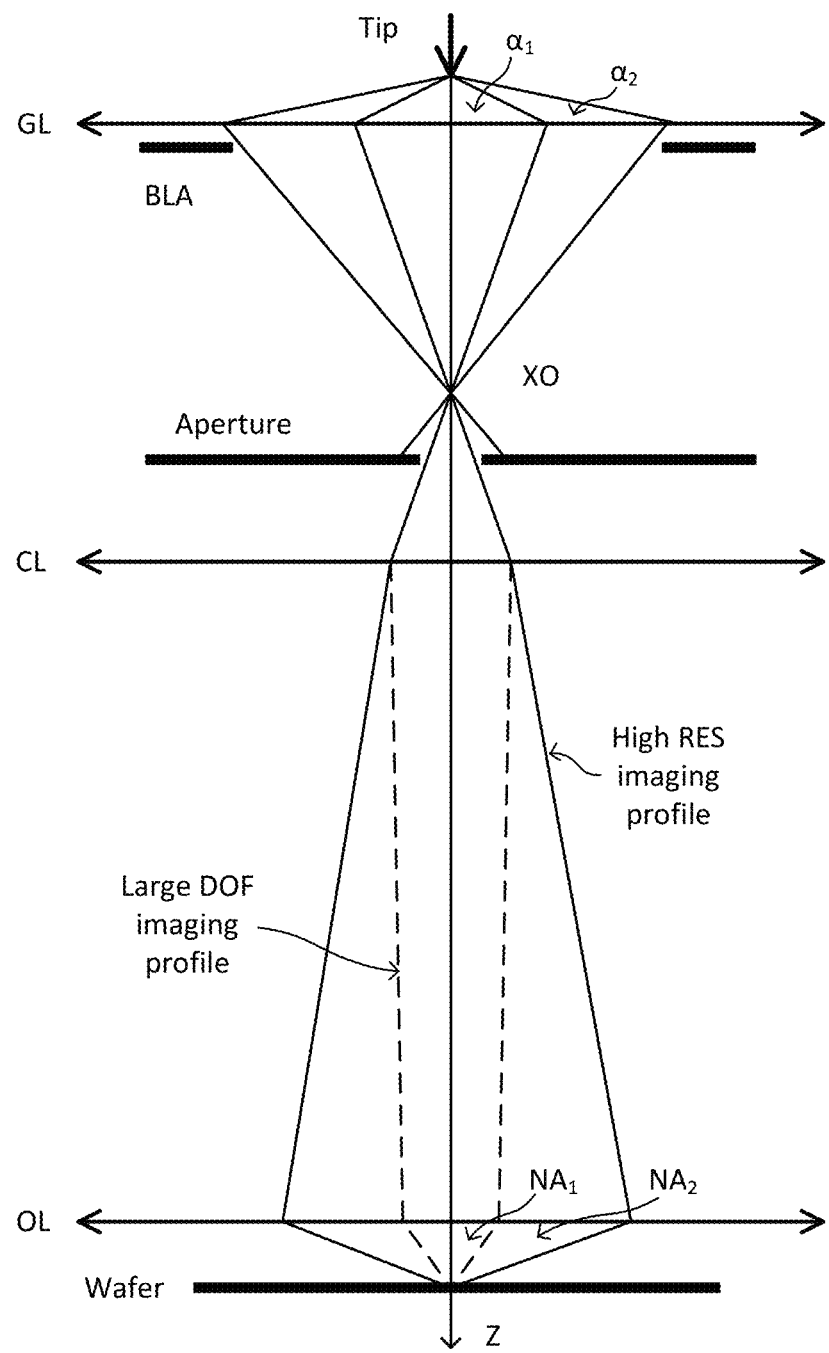
FIG. 6(b) is the optics of the first embodiment of the electron beam system of FIG. 6(a)

FIG. 6(a) shows the first embodiment of an electron beam system 100. FIG. 6(b) shows the schematic of the optics of the embodiment of FIG. 6(a). A magnetic gun lens may be used in the electron beam system 100. This can reduce the gun lens aberrations, such that the blurs at the wafer side from the gun are negligibly dominant even though the optical magnification is increased for smaller NA or larger DOF. This also can enable focus/defocus of the high voltage electron beam to select a desired beam current.

The electron beam system 100 includes an electron beam source 101 that generates an electron beam 103. The electron beam 103 is directed at a wafer 110, which can be positioned on a platen. The electron beam source 101 can include a tip with a radius less than 1 µm, such as from approximately 0.3 µm to less than 1.0 µm. The electron beam source 101 also can include an extractor 115, anode 116, gun magnetic lens coil 117, and gun magnetic lens pole pieces 118. These components can be part of the gun lens (GL).

A small radius tip (e.g. low sub-microns) of a thermal-field emission (TFE) electron source can provide high brightness and small virtual source size. In a small NA optics with a large optical magnification (e.g., approximately 1.0×), the virtual source size may affect degradation of the resolution. Chromatic aberration may be less important in a high BV and high LE optics, but the source energy spread can be increased with a small radius tip of TFE electron sources.

A beam-limiting aperture (BLA) 102 is disposed in a path of the electron beam 103. The beam-limiting aperture 102 can select the highest beam current in an application. The beam-limiting aperture 102 can include an aperture with a diameter or cross-sectional length from approximately 50 µm to approximately 100 µm for the various beam currents.

An aperture 104 can be disposed in the path of the electron beam 103 between the condenser lens 105 and the beam-limiting aperture 102. The aperture 104 can have a diameter or cross-sectional length from approximately 10 µm to approximately 30 µm. The crossover (xo) position can be adjustable based on the strength of the gun lens. The aperture 104 can be a column aperture.

A magnetic condenser lens 105 is disposed in the path of the electron beam 103 between the upper Wehnelt electrode 107 and the beam-limiting aperture 102. For example, the magnetic condenser lens 105 can be disposed in the path of the electron beam 103 between the aperture 104 and the deflector 106. The magnetic condenser lens 105 can include pole pieces 111, a condenser lens coil 112, and a shield 125.

A magnetic condenser lens 105 can be used to select an optimum NA or a smaller NA for larger DOF. An electrostatic condenser lens may be insufficiently strong to focus a high energy electron beam because focusing voltages can be limited to avoid arcing issues. The magnetic condenser lens 105 can further focus the beam. The magnetic condenser lens 105 includes the magnetic pole pieces 111 and coils 112.

A deflector 106 is disposed in the path of the electron beam 103 between the upper Wehnelt electrode 107 and the condenser lens 105. The deflector 106 can be a magnetic deflector or a Wien filter.

An objective lens (OL) 119 can be included. A magnetic objective lens coil 113 is disposed in the path of the electron beam 103 between the deflector 106 and the upper Wehnelt electrode 107. A ground tube 114 is disposed in the path of the electron beam 103 such that the magnetic objective lens coil 113 is disposed around the ground tube 114. The ground tube 114 can face the electron beam 103 such that the ground tube is between the electron beam 103 and the magnetic objective lens coil 113.

The objective lens 119 is a combined lens that includes an electrostatic objective lens and a magnetic objective lens. The objective lens 119 include the ground tube 114, upper Wehnelt (UW) electrode 107, and lower Wehnelt (LW) electrode 108. The upper Wehnelt electrode 107 and/or lower Wehnelt electrode 108 can be electrostatic. The objective lens 119 can have a suitable working distance for minimizing the lens aberrations without letting the objective lens pole pieces 120 become saturated. In an instance, the working distance is from approximately 1 mm to 3 mm. For lower landing energies (e.g., approximately 0.1-10 keV), an approximately 1 mm working distance may be used. A working distance of approximately 3 mm may be used for higher LEs (e.g., approximately 30-60 keV). The objective lens 119 also can include the magnetic pole pieces 120 and coils 113. In an instance, the lower magnetic pole piece can be used as the lower Wehnelt (LW) electrode 108.

An upper Wehnelt electrode 107 is disposed in the path of the electron beam 103 between the lower Wehnelt electrode 108 and the beam-limiting aperture 102. For example, the upper Wehnelt electrode 107 can be disposed in the path of the electron beam 103 between the deflector 106 and the lower Wehnelt electrode 108. The upper Wehnelt electrode 107 may be grounded, negative floating, or positive floating, depending on various applications.

Figure 12:
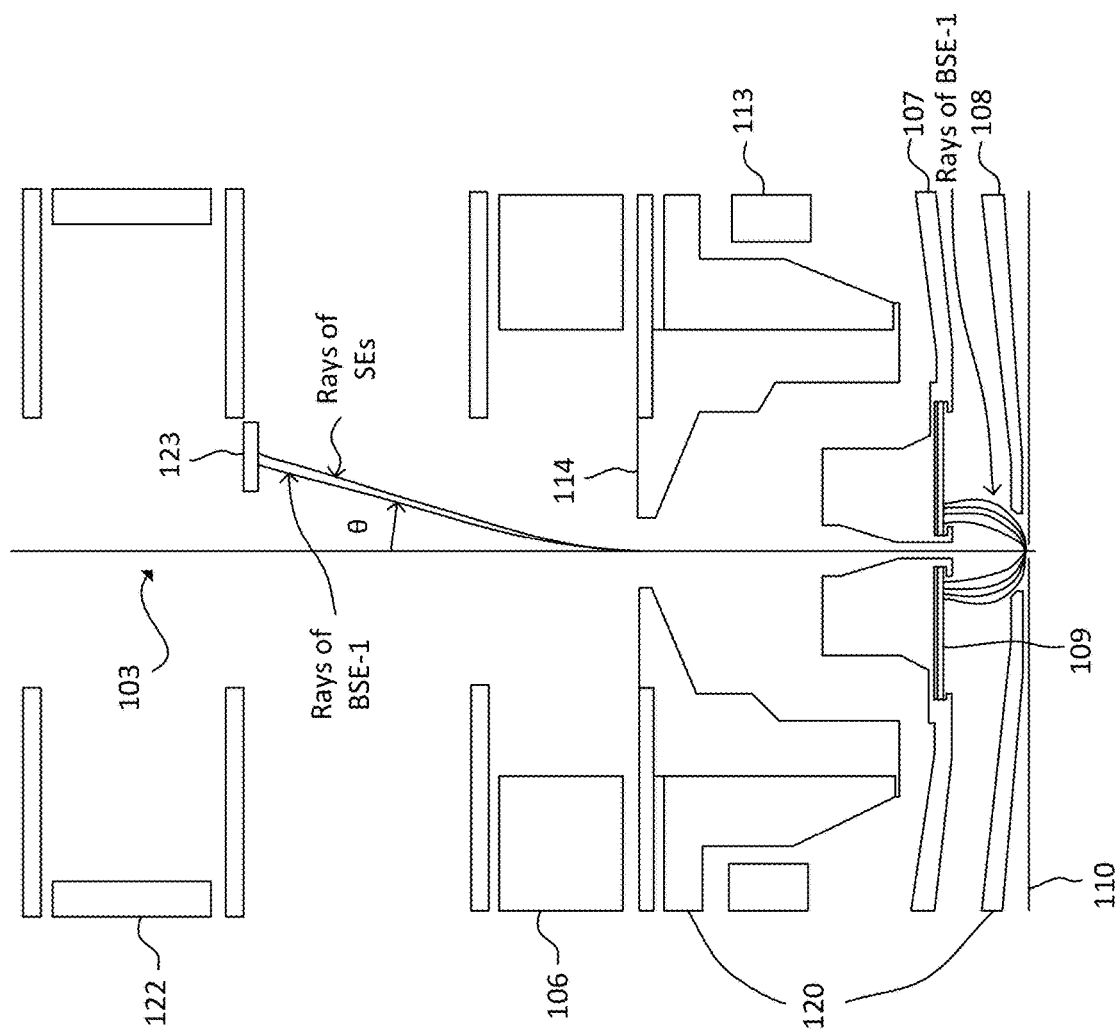
FIG. 12 is the SE/BSE collections in the third embodiment of FIG. 9 for the use with low landing energies.

The upper Wehnelt electrode 107 can be run with positive voltage to reduce the chromatic aberration of the objective lens, reduce Coulomb interaction effects, or help collect BSEs. The shape of the upper Wehnelt electrode 107 can be configured to accommodate the annular detector 109, which is used to increase BSE collection efficiency. The center aperture size of the upper Wehnelt electrode 107 may be around 1 mm to allow all SEs and small-angle BSEs to pass through and to be collected by the side detector 123 (as shown in FIG. 12).

A lower Wehnelt electrode 108 is disposed in the path of the electron beam 103. The lower Wehnelt electrode 108 can charge the wafer 110 for a suitable extracting field for various inspections of wafer layers. The extracting field can be from approximately 0 V/mm to 2000 V/mm. Lower extracting fields (e.g., approximately 0-500 V/mm) are typically for inspections and higher extracting fields (e.g., approximately 1000-2000 V/mm) are typically for reviews An annular detector 109 is disposed on a surface of the upper Wehnelt electrode 107 that faces the lower Wehnelt electrode 108. The annular detector 109 is a detection device that can collect BSEs. An annular detector 109 around the optical axis can collect the BSEs that are generated at the bottom of a memory hole and that penetrated through the stacked thin film materials. The annular detector 109 (e.g., a semiconductor detector) around the optical axis may be buried on the bottom of the upper Wehnelt electrode 107. The active area of the annular detector 109 can facing to the wafer 110, and its backside may be commonly biased to hundreds of Volts (e.g., approximately 100-300 V) for forming a detection signal circuit.

The tip radius in an electron beam source 101 can be in low sub-microns. The extractor 115 voltage can be set higher than the tip bias for sufficient source brightness and angular intensity. The tip-emitted electrons are accelerated by the anode 116 to from approximately 50 kV and 100 kV and focused by the magnetic condenser lens 105 to form an electron beam crossover in between the beam limiting aperture 102 and the aperture 104. The aperture 104 can select a practical beam current delivered to wafer 110. In FIG. 6(a), a Wien filter or a magnetic deflector may be deployed for splitting the SEs and/or BSEs from the primary electrons (PEs). The aperture 104 can be an independent aperture rod which includes multiple apertures. If one aperture is damaged or contaminated, then another one may be moved to replace the damaged or contaminated aperture.

There may be two imaging modes for different applications in FIG. 6(b). One imaging mode is a high resolution (RES) mode with relatively small DOF. Another imaging mode is the large DOF mode with relatively low resolution. In the high resolution mode, the condenser lens 105 focuses the electron beam 103 to form an optimum NA (e.g., the $NA_2$ in FIG. 6(b)), at which the electron beam spot size at wafer is minimized. In the large DOF mode, the condenser lens 105 further focuses the beam to form a smaller NA (e.g., the $NA_1$ in FIG. 6(b)), at which the DOF is maximized to meet the requirements for the inspections and reviews of high AR devices like 3D NAND, 3D DRAM, and deep trench logic.

Figure 5A:
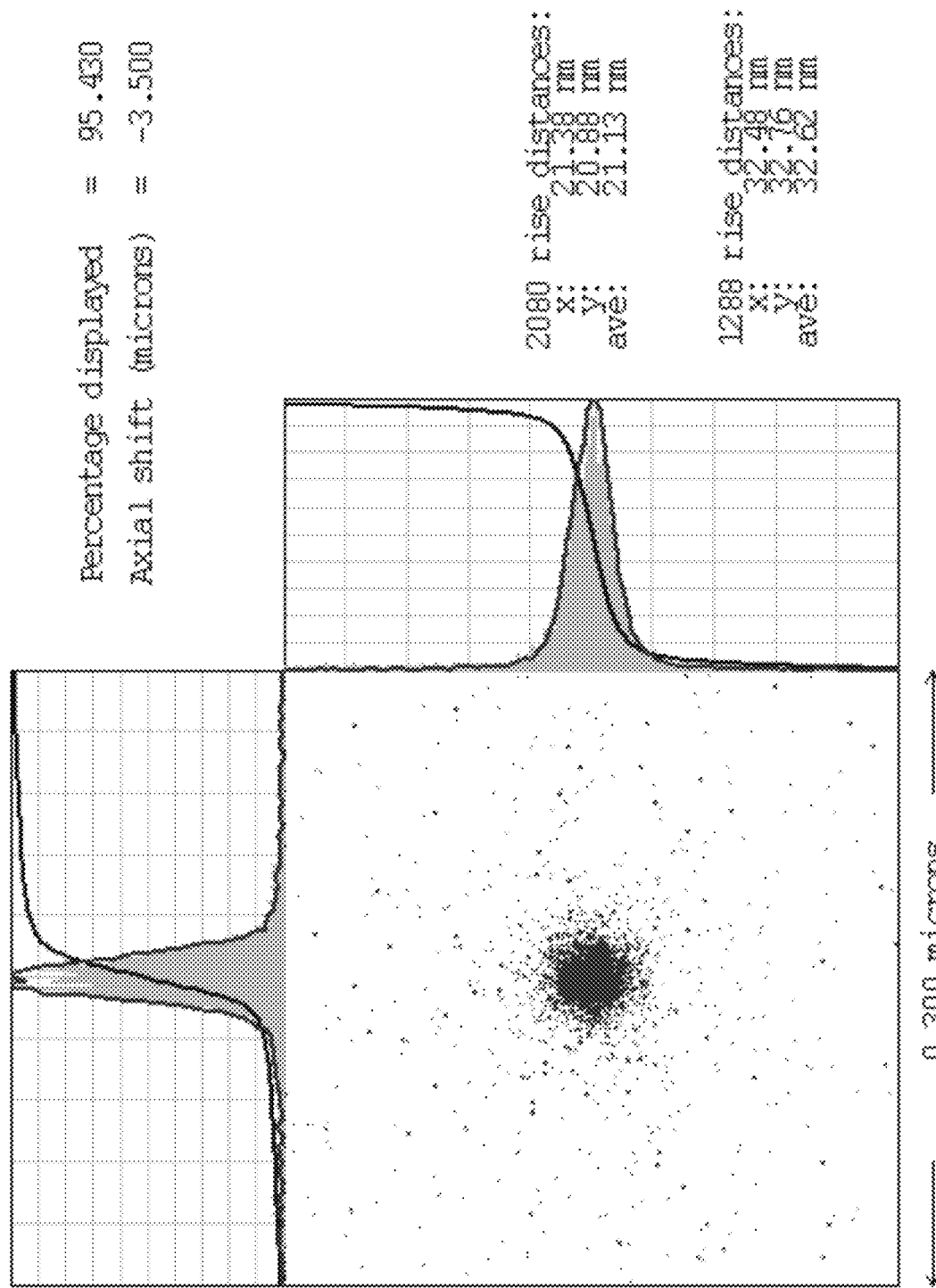
FIG. 5(a) is a primary electron distributions at the top ($z=-3.5$ μm) of a memory hole of 0.3×0.3 μm.
Figure 5B:
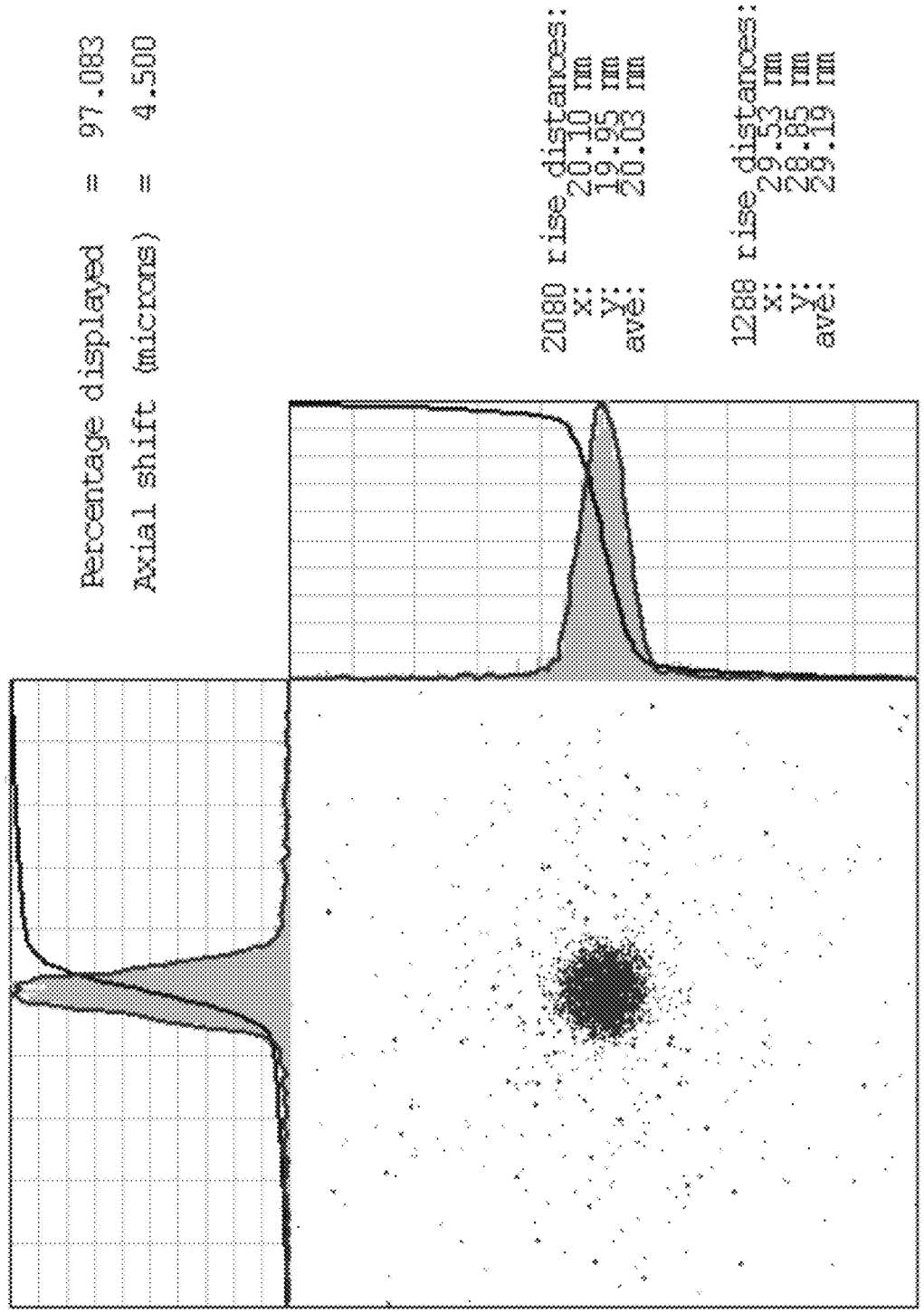
FIG. 5(b) is a primary electron distributions at the bottom ($z=4.5$ μm) of a memory hole of 0.3×0.3 μm.
Figure 7A:
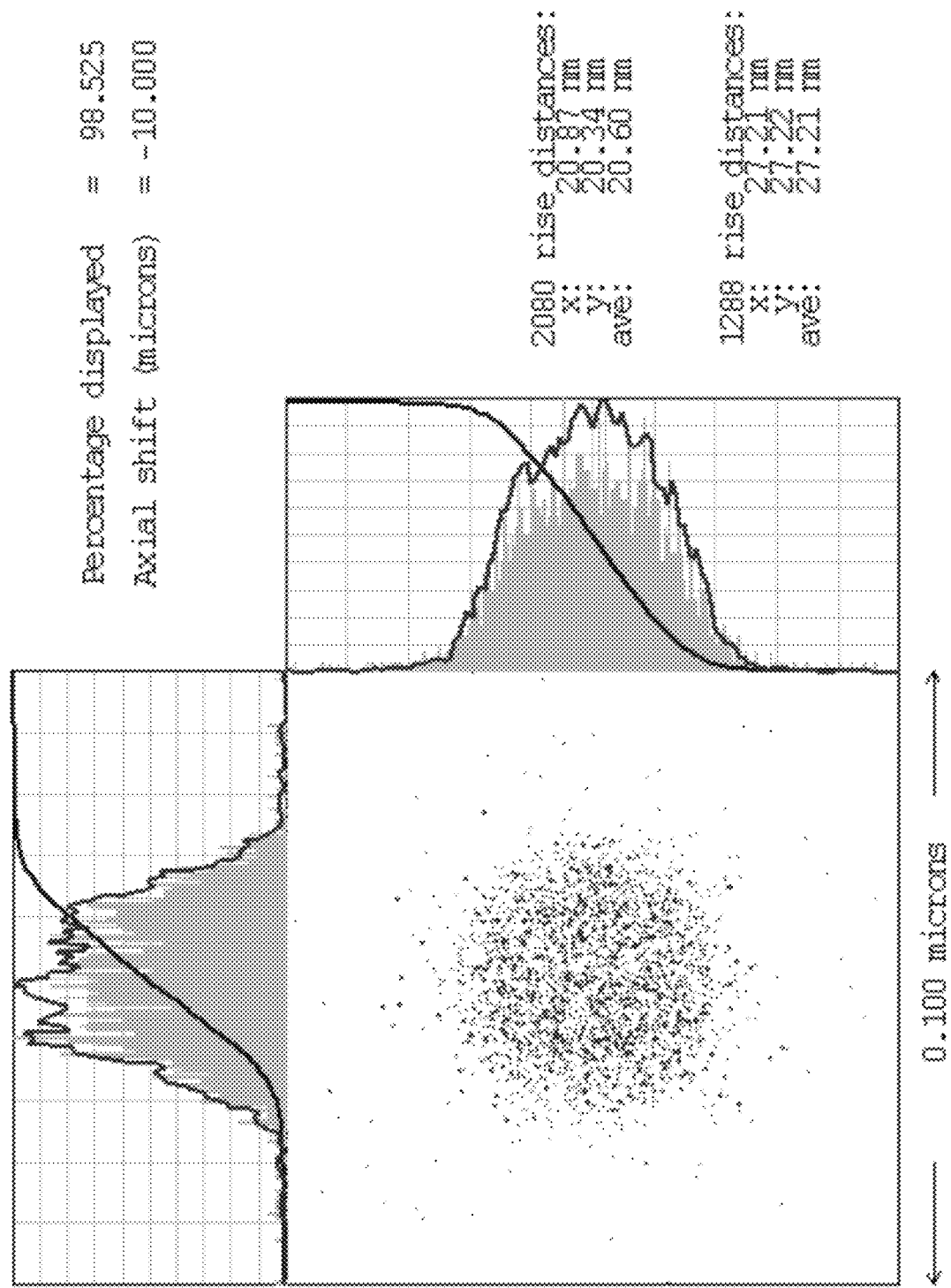
FIG. 7(a) is a primary electron distributions at the top ($z=-10$ μm) of a memory hole of 0.1×0.1 μm.
Figure 7B:
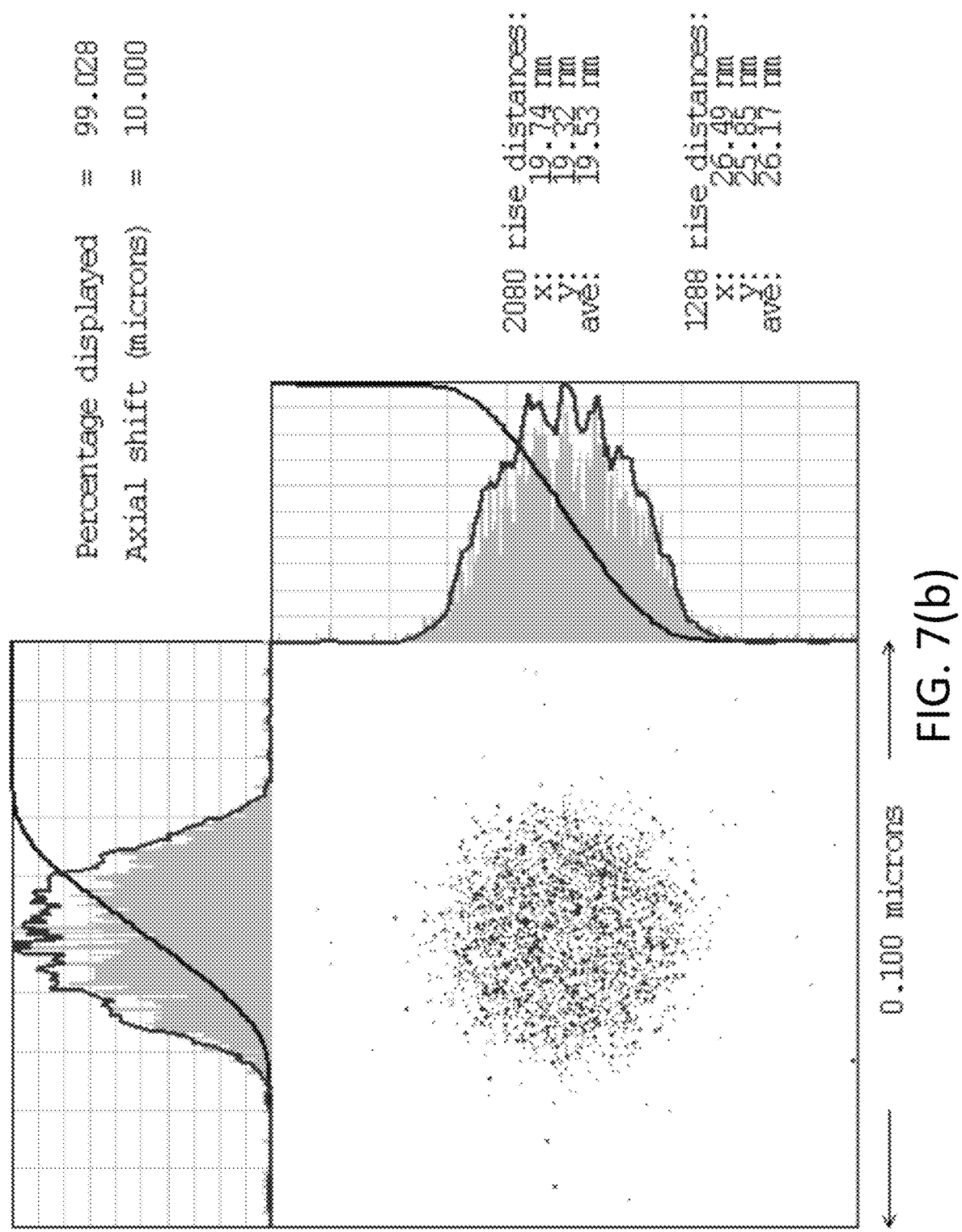
FIG. 7(b) is a primary electron distributions at the bottom ($z=10$ μm) of a memory hole of 0.1×0.1 μm.

FIGS. 7(a) and 7(b) show Monte Carlo simulation results for the FIG. 6(a) electron optical column with the large DOF mode at a 60 kV beam energy and 55 keV landing energy. The upper Wehnelt electrode is grounded in this simulation. To compare with FIGS. 5(a) and 5(b), the beam current and extracting field at the wafer are set the same as FIGS. 5(a) and 5(b) in the simulations for FIGS. 7(a) and 7(b).

In FIGS. 7(a) and 7(b), the primary electrons are narrowly distributed with short tails in x and y directions due to reduced Coulomb interactions between electrons with high beam voltages. Even for a small memory hole size of 0.1×0.1 μm as shown in FIGS. 7(a) and 7(b), more than 98 electrons (the percentage displayed in FIGS. 7(a) and 7(b)) are included at the hole top with z=−10 μm (FIG. 7(a)) and bottom with z=10 μm (FIG. 7(b)), respectively, meaning that the aspect ratio is as high as AR=0.1:20=1:200. The DOF of 20 μm in this application is large, and the resolutions are still better than those of FIGS. 5(a) and 5(b) when comparing the spot sizes measured with 20-80 and 12-88 current sizes in FIGS. 7(a) and 7(b) to those in FIGS. 5(a) and 5(b).

Figure 1:
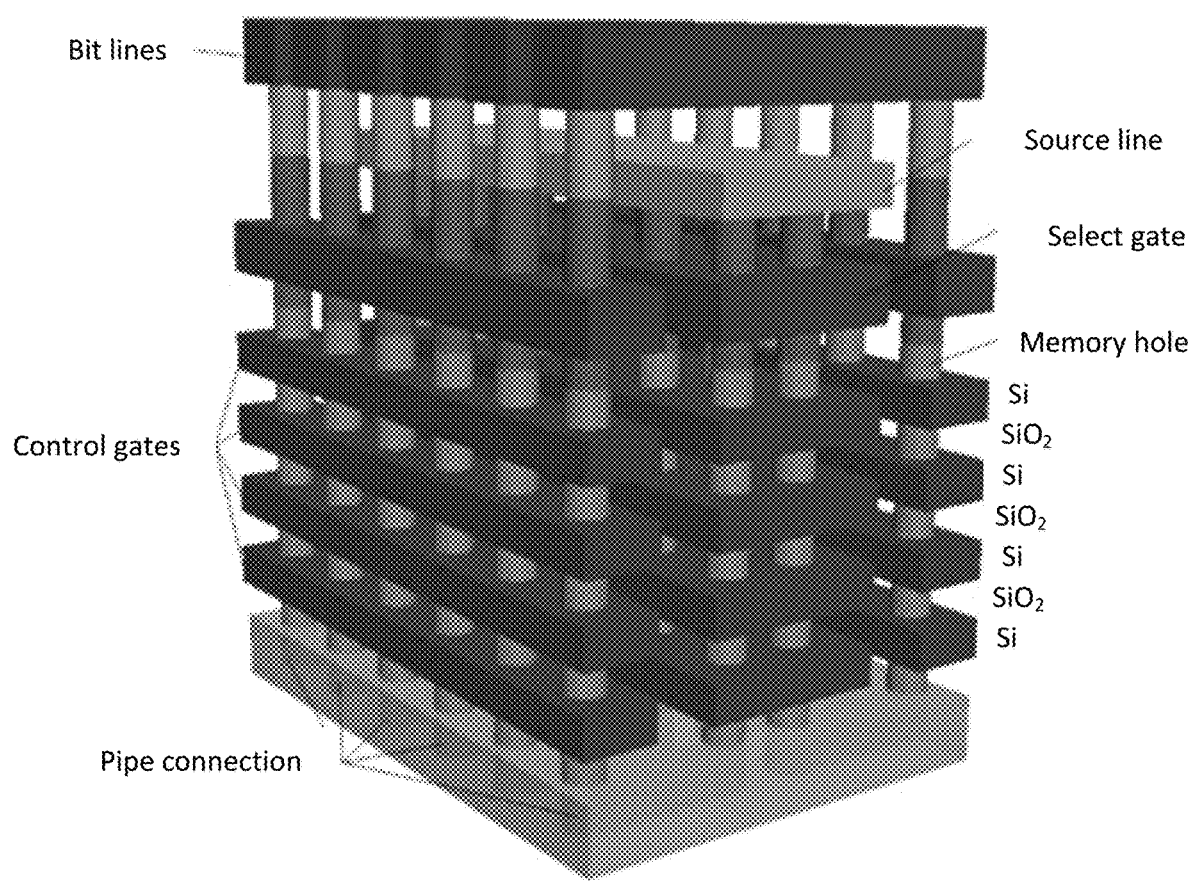
FIG. 1 is a schematic of an exemplary 3D NAND flash memory.
Figure 2:
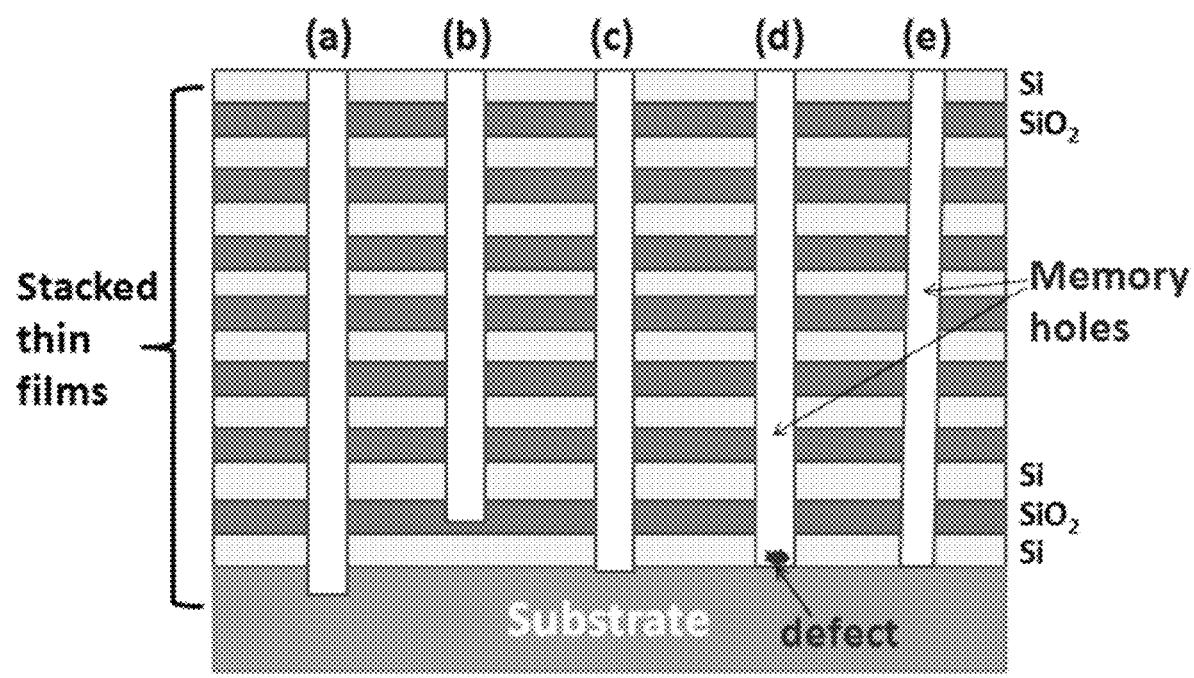
FIG. 2 is a model of stacked bits and memory holes in an exemplary 3D NAND flash device.
Figure 3:
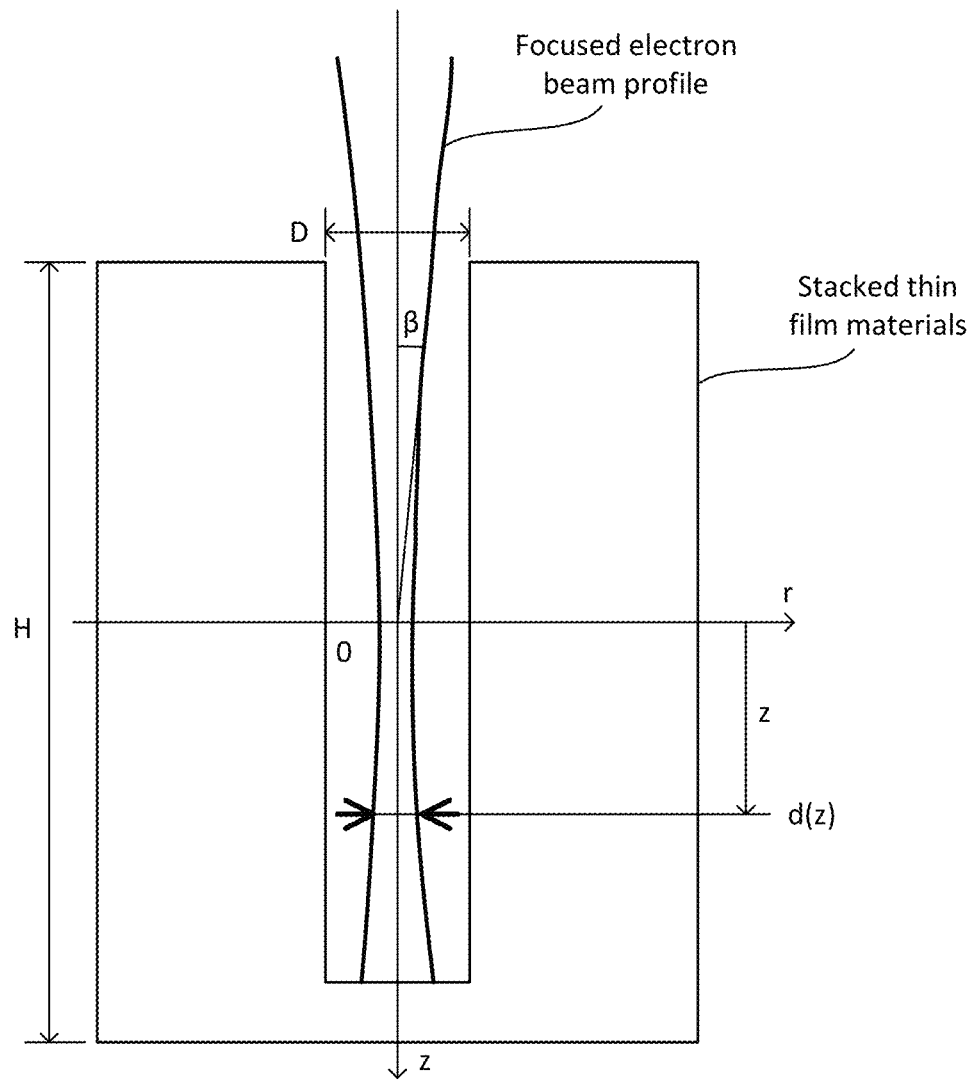
FIG. 3 is a model of focused electron beam profiles in an exemplary HAR memory hole.
Figure 4:
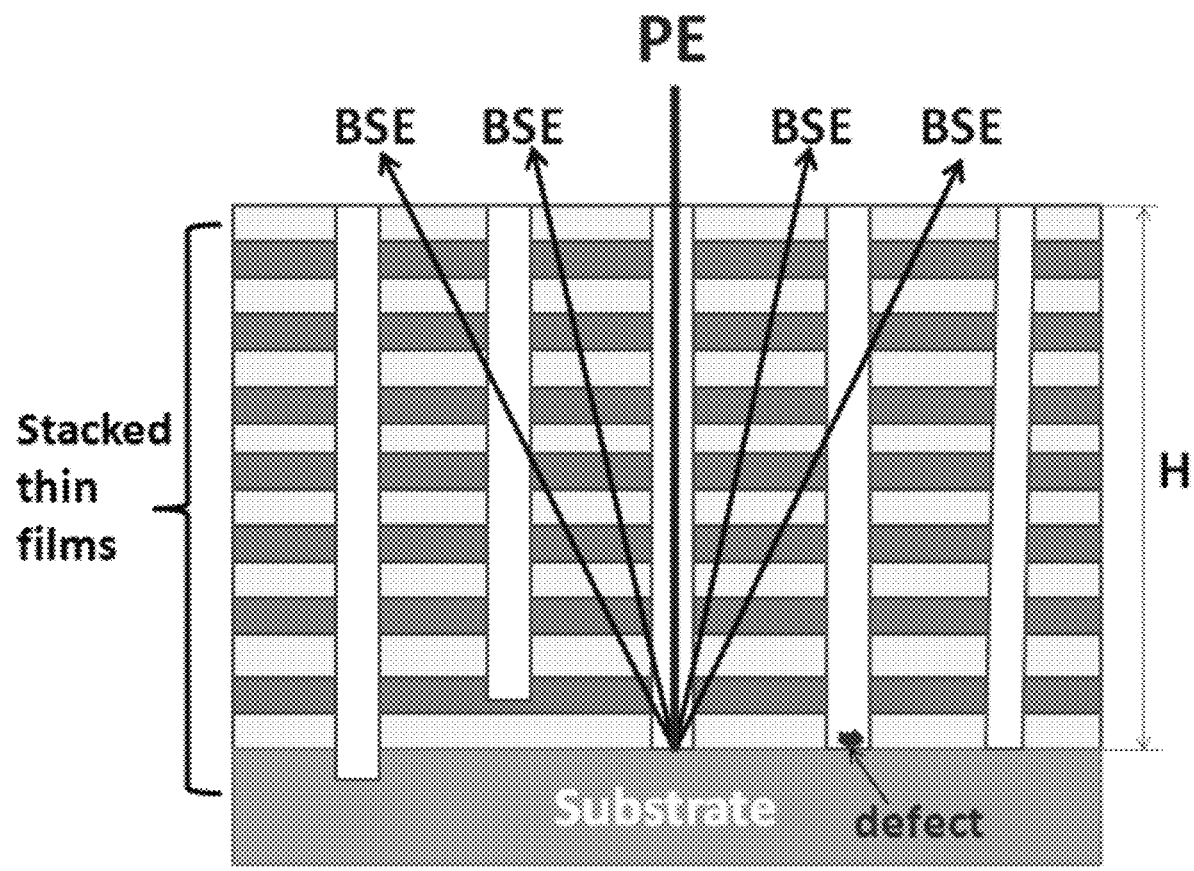
FIG. 4 is a schematic of BSE penetrating materials from bottom of an exemplary memory hole and escaping from the top surface of the materials.

When the electrons with high landing energies (e.g., from approximately 50 keV to 100 keV) bombard onto the bottom of the memory holes, the same high energy BSEs are generated and penetrate out of the stacked materials of the thin films for hundreds of 3D NAND layers, as shown in FIG. 4. These BSEs may be collected by the BSE detectors in the primary electron beam column.

Figure 8:
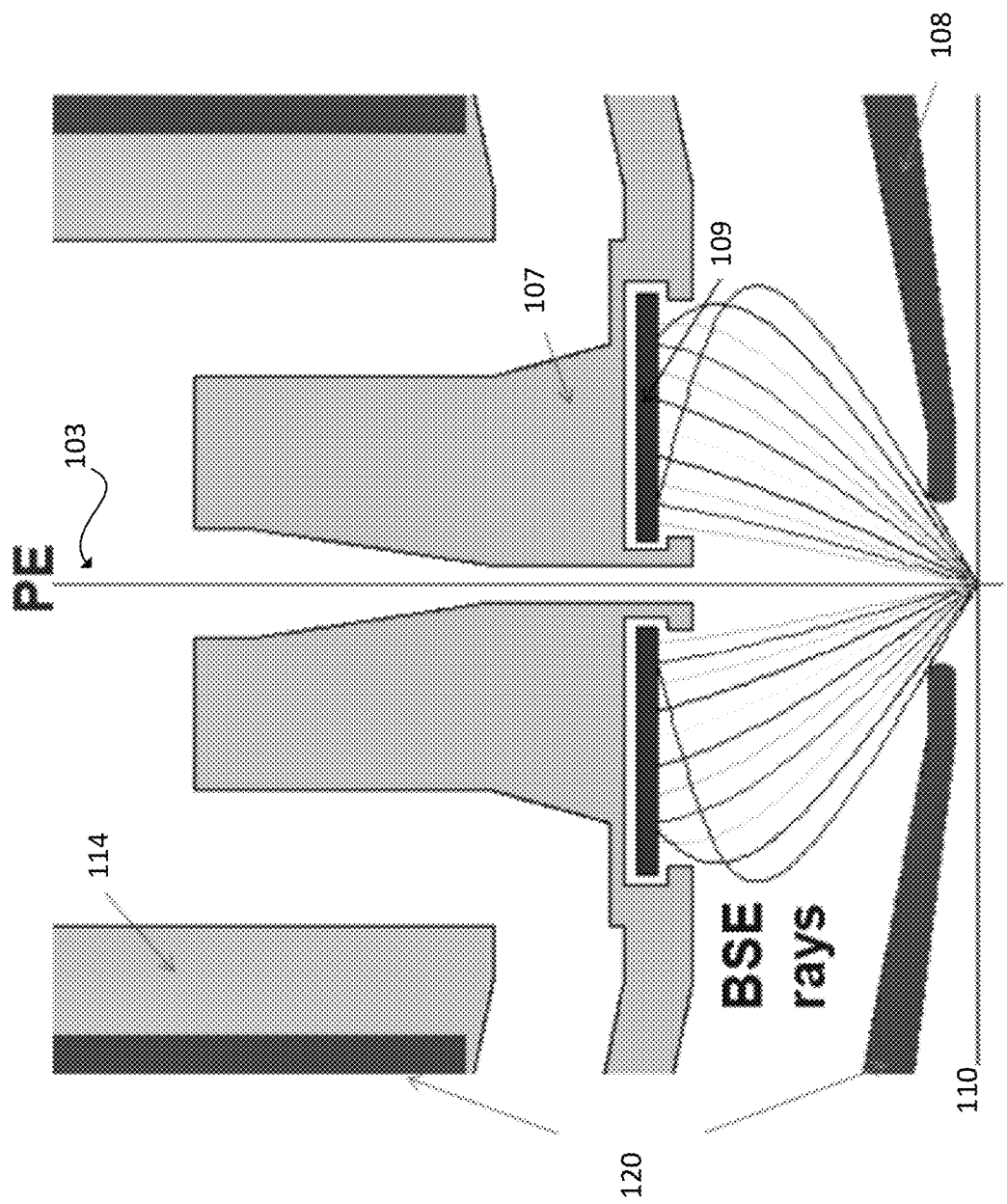
FIG. 8 is a second embodiment of a system for BSE detection.

FIG. 8 is a second embodiment of a system for BSE detection. The annular detector 109 for detecting BSEs around the optical axis may be at least partly inside the upper Wehnelt electrode 107. In an instance, a surface of the annular detector 109 can be exposed to BSEs. In another instance, the annular detector 109 is totally inside the upper Wehnelt electrode 107 without exposure to the BSEs, which still allows BSE collection.

The upper Wehnelt electrode 107 may either be floated or grounded. The lower Wehnelt electrode 108 can be used to charge the wafer for a required extracting field. With the same conditions as those for FIGS. 7(a) and 7(b), the simulations for ray-tracing the BSEs from the bottom of a 3D NAND memory hole show high collection efficiency. Thus, the BSEs with the polar angles from approximately 10 to 60 degrees may be detected. Because of the characteristics of the BSE angular distributions, most of the total emitted BSEs have been included in the angles of from approximately 10 to 60 degrees.

Figure 9:
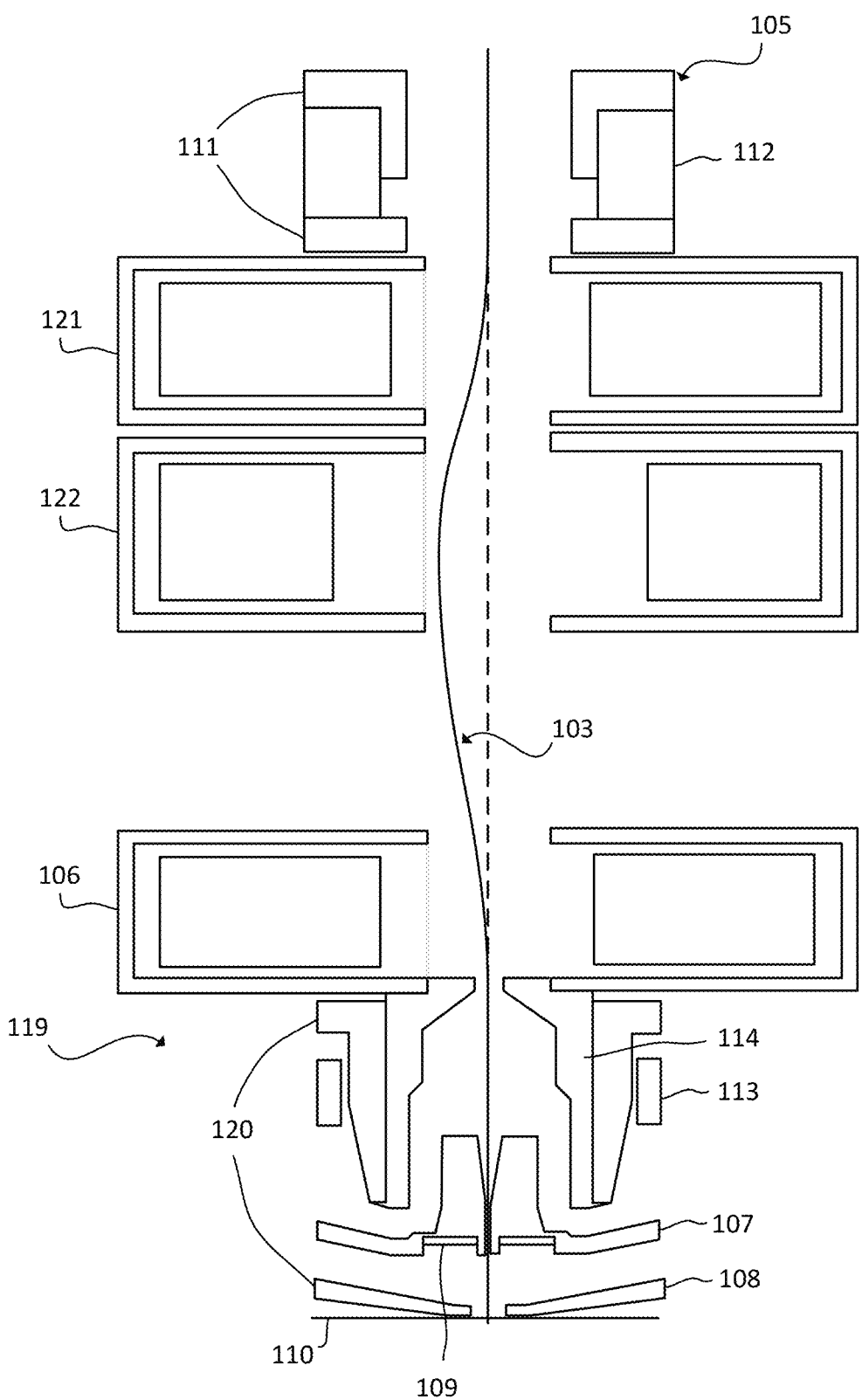
FIG. 9 is a third embodiment of an electron beam splitting optics with three magnetic deflectors.

FIG. 9 is a third embodiment of an electron beam splitting optics with three magnetic deflectors. In the embodiment of FIG. 9, the deflector 106 is a magnetic deflector (MD-3). For only collecting and using the high energy BSEs to inspect high AR devices like 3D NAND memories, an optical design like a conventional Wien filter for splitting the BSEs from the PEs (primary electrons) is not required.

The system also includes an upper magnetic deflector 121 (MD-1) and a middle magnetic deflector 122 (MD-2) disposed in the path of the electron beam 103 between the deflector 106 and the magnetic condenser lens 105. The upper magnetic deflector 121 is disposed in the path of the electron beam 103 between the deflector 106 and the magnetic condenser lens 105. The middle magnetic deflector 122 is disposed in the path of the electron beam 103 between the upper magnetic deflector 121 and the magnetic deflector 106.

The upper magnetic deflector 121 can be configured to deflect the electron beam 103 to the middle magnetic deflector 121. The middle magnetic deflector can be configured to deflect the electron beam 103 toward the magnetic deflector 106 in a direction opposite that of the upper magnetic deflector 121. The magnetic deflector is configured to deflect the electron beam 103 and collimate the electron beam 103 along the path into the ground tube 114.

The embodiment of construction in FIG. 6 can be operated in two optical modes. One mode is a large DOF mode with a smaller NA for inspections and reviews of HAR NAND flash memories. Another mode is a high resolution mode with an optimum NA for inspecting and reviewing the physical defects at the wafer surface or the voltage-contrast defects inside the wafer sub-surface in ranges of tens to hundreds of nanometers. In a high resolution mode, all the lens aberrations and all the blurs caused by Coulomb interactions between electrons are balanced. The landing energies (LE) for inspecting the wafer surface should be low in hundreds to thousands of electron Volts. The SEs can be signals collected for inspections and reviews. Because of the low emission energy (e.g., several electron Volts), the SEs may be strongly focused by the magnetic field from the objective lens. Accordingly, the SEs are not always well-collected by annular detectors, instead and can be collected by side detectors.

To split the SEs from the PEs, a Wien filter is conventionally used. However, a Wien filter can generate transfer chromatic blurs due to the source energy spread. To eliminate the transfer chromatic blur, another Wien filter can be used to compensate the trajectory displacements caused by the source energy spread. This can provide the desired operation, but can increase complexity of the optics.

Figure 14:
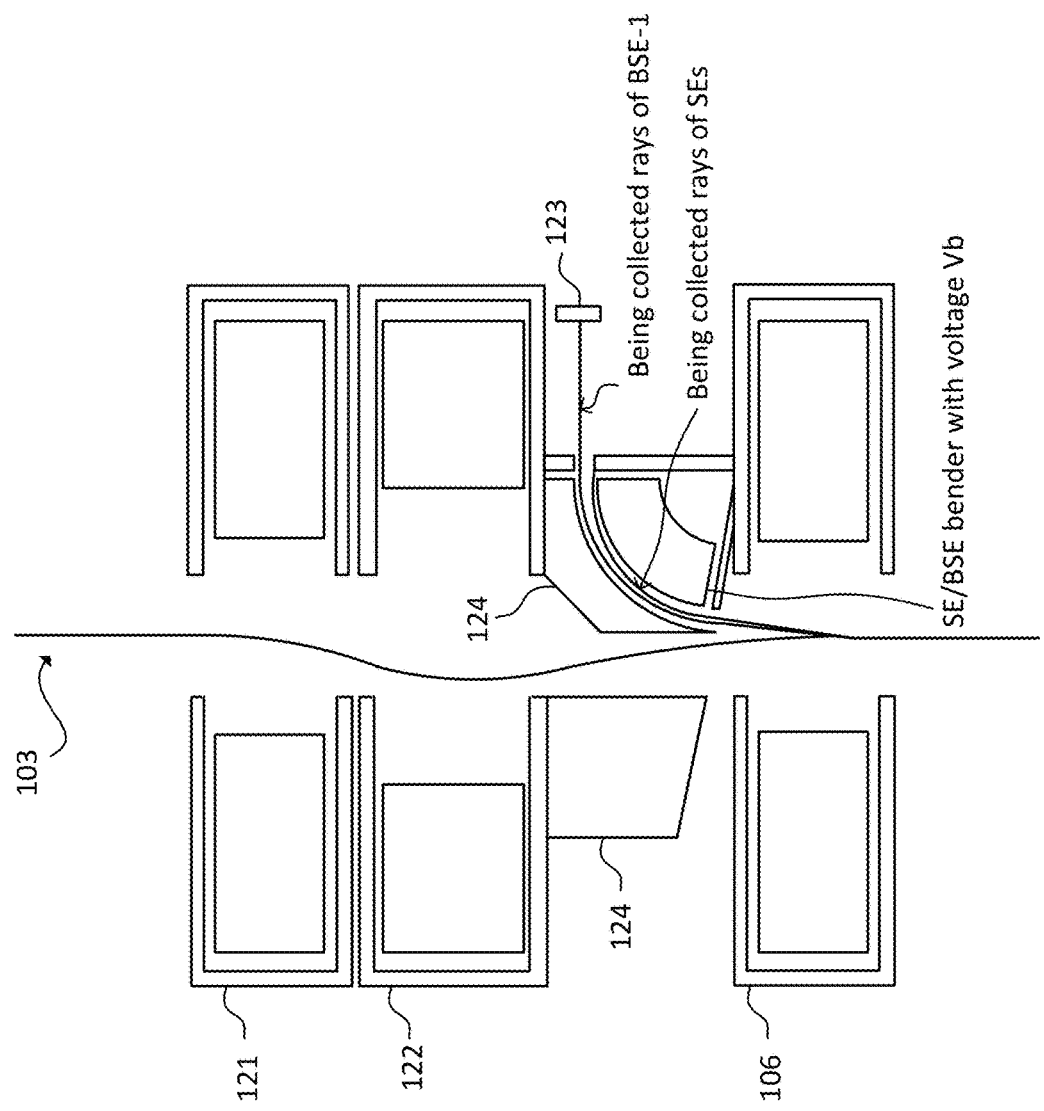
FIG. 14 is an embodiment of an electron beam bender.

As shown in FIG. 9, a Wien-filter-free electron beam splitting optics can be used. Three magnetic deflectors (upper magnetic deflector 121, middle magnetic deflector 122, and deflector 106) are deployed in between the condenser lens 105 and objective lens 119. The upper magnetic deflector 121 deflects the electron beam 103 from the source to the middle magnetic deflector 122, the middle magnetic deflector 122 deflects the electron beam 103 toward deflector 106 in an opposite direction, and the deflector 106 deflects the electron beam 103 back again and collimates the electron beam 103 along the optical axis into the objective lens 119. The angle of deflection can be related to the side detector 123. In FIG. 12 or FIG. 14, the side detector 123 is in the xoz plane, so primary electrons are deflected in the same xoz plane with an opposite direction. For the xoz deflection of the primary electrons, the magnetic deflector flux fields can be in the yoz plane, meaning the magnetic deflector rotation degrees are fixed according to FIG. 11.

Figure 10:
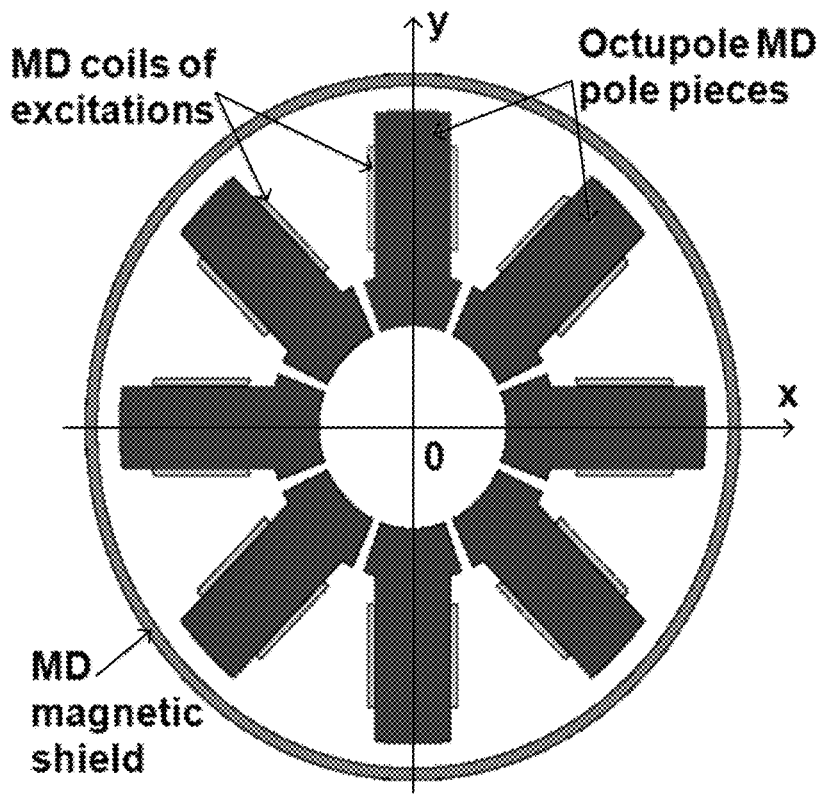
FIG. 10 is an octupole magnetic deflector in the third embodiment of FIG. 9.
Figure 11:
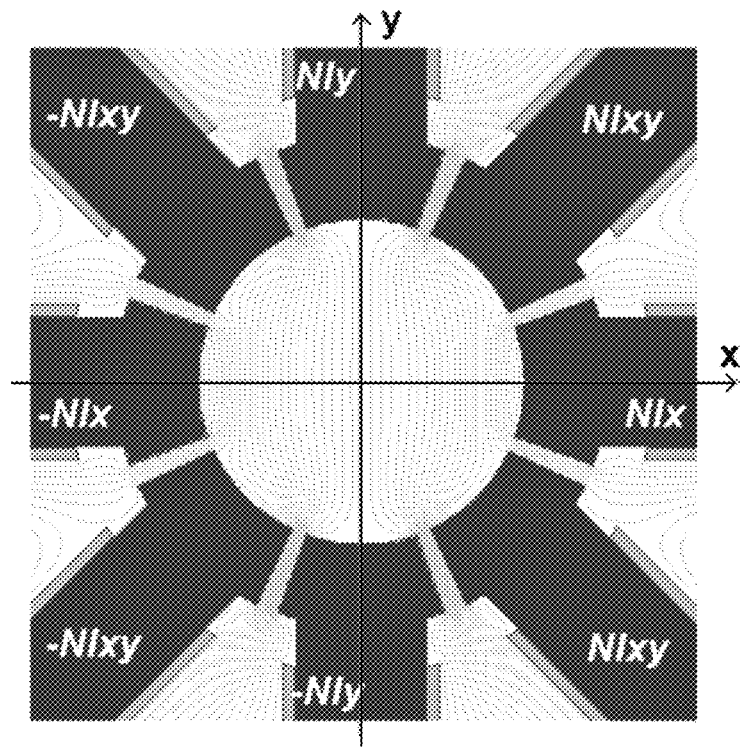
FIG. 11 shows magnetic equipotential lines in the octupole magnetic deflector of the third embodiment of FIG. 9.

Each of the upper magnetic deflector 121, middle magnetic deflector 122, and deflector 106 can have the same structure and/or configuration, such as that shown in FIG. 10 and FIG. 11. FIG. 10 shows the cross-section view of a magnetic deflector. Eight magnetic pole pieces are rotationally symmetric arranged as an octupole deflector. The same numbers of the coil turns (the "N" in FIG. 11) are wound around each pole piece. The pole pieces are shielded as shown. With suitable settings of the currents through the coils, the distributions of the magnetic deflection fields in a large area may be fairly homogeneous for minimizing the coma blur due to large angle deflections. With the equipotential lines, FIG. 11 exhibits the simulations of the homogeneous magnetic deflection fields, in which the coil currents are applied as Ix=1 unit, Ixy=1/$\sqrt{2}$ units, and Iy=0 units. The magnetic flux of the fields in x-axis deflects the primary electron beam in y-axis, as shown in FIG. 9.

Even with low landing energies, high image-forming resolutions of the primary electron beam can still be achieved using embodiments disclosed herein because of the large and optimum NA (the $NA_2$ in FIG. 6(b)) at which the Coulomb interactions between electrons are reduced. The total spot size may be half given by the objective lens aberrations and another half by the Coulomb interactions. The objective lens aberrations and Coulomb interaction effects can be further reduced by using the upper Wehnelt electrode 107 as disclosed in FIG. 9. The upper Wehnelt electrode 107 may be considered as an energy boosting tube. The voltage applied on the upper Wehnelt electrode 107 can be higher than the beam voltage. Given the same extracting field through the lower Wehnelt electrode 108 charging the wafer 110, simulations show that an upper Wehnelt electrode 107 voltage higher than the beam voltage means the spherical and chromatic aberration coefficients of the objective lens 119 will be lower, and the Coulomb interaction effects also will be simultaneously lower.

The three magnetic deflector embodiment of construction in FIG. 9 can eliminate the transfer chromatic blurs normally-generated in a Wien filter due to the source energy spread. In a Wien-filter-based optics, another additional Wien filter may be used to compensate the trajectory displacements due to the source energy spread. In the three magnetic deflector configuration in FIG. 9, the total net magnetic deflection angle is zero, making the total electron trajectory displacement due either to the source energy spread, the electronic noises, and/or the thermal noises all zero.

Figure 13:
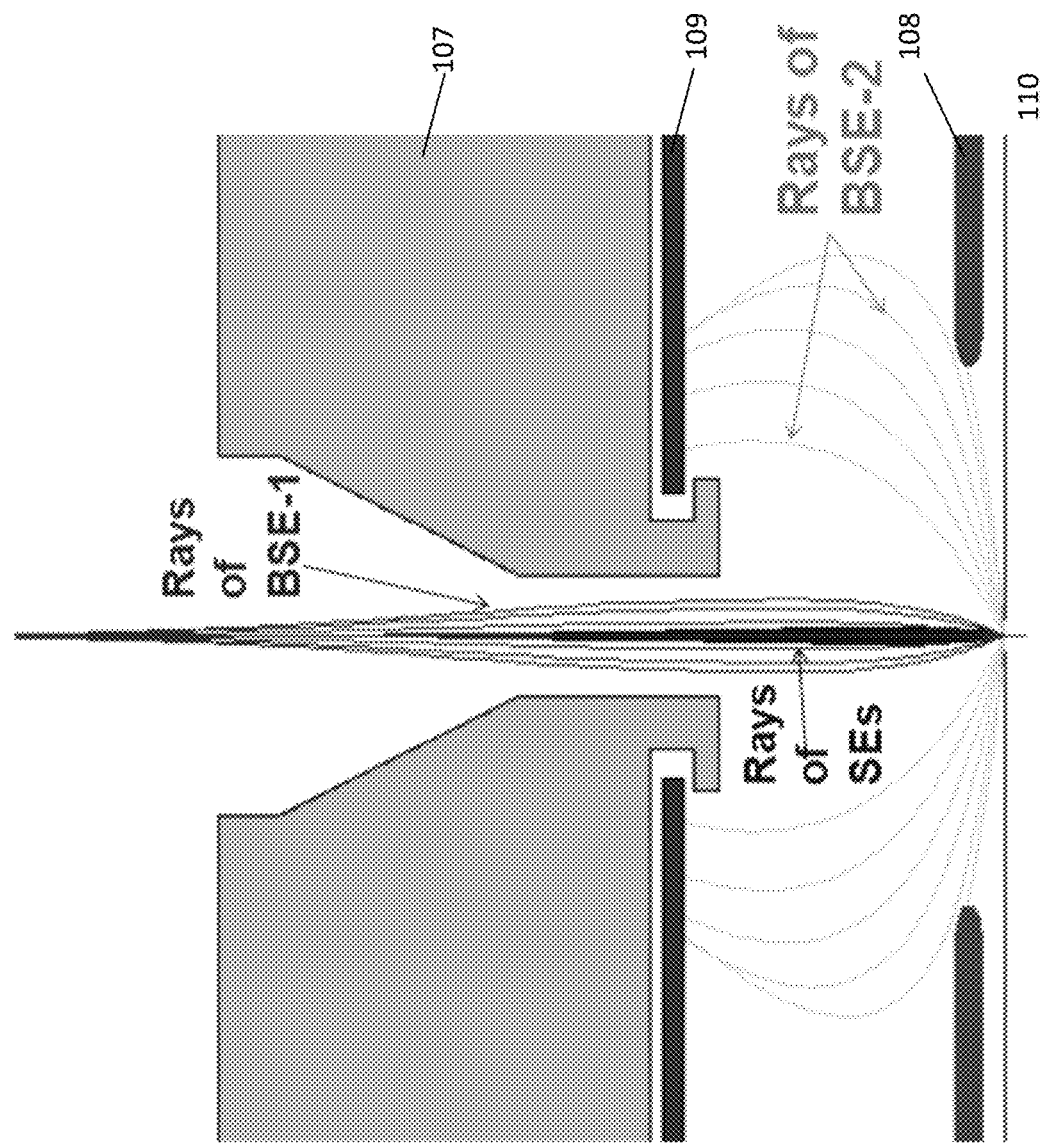
FIG. 13 illustrates ray-tracing simulations for the SE/BSE in low landing energy applications.

FIG. 12 shows SE/BSE collections in the third embodiment of FIG. 9 for the use with low landing energies. FIG. 13 illustrates ray-tracing simulations for the SE/BSE for low landing energies. A side detector 123 is disposed between the middle magnetic deflector 122 and the magnetic deflector 106. The SE deflection angle θ from deflector 106 is normally from approximately 6° to 12°, which means the distance from deflector 106 to the side detector 123 is approximately 100 mm or longer.

The side detector 123 is configured to collect at least SEs. While illustrated between the middle magnetic deflector 122 and the magnetic deflector 106, the side detector 123 can be between the upper magnetic deflector 121 and the middle magnetic deflector 122. The side detector 123 also can be upstream of the upper magnetic deflector 121. The side detector 123 can be a semiconductor detector, a high speed scintillator detector, or other systems.

FIGS. 12 and 13 show the SE/BSE collection. Due to the opposite moving directions of the PEs and SEs, the deflector 106 deflection angle of the SEs is opposite to PEs as angle θ shown in FIG. 12. A side detector 123 is disposed below the middle magnetic deflector 122 in the embodiment of FIG. 12. For a given beam voltage and landing energy, the excitation of the deflector 106 can be selected to allow the SEs to be deflected an angle of θ and guide the SEs towards to the center of the side detector 123. Given the deflector 106 excitation, the excitations of the upper magnetic deflector 121 and middle magnetic deflector 122 can be adjusted to collimate the source-emitted beam to the optical axis of the objective lens.

For the high resolution used with low landing energies of hundreds to thousands of electron Volts, the low energy BSEs can be also collected in the way shown in FIG. 13. All the SEs have the lower emission energies (several eVs) and are immediately focused by the magnetic field of the objective lens into a thin beam, as show in the central beam in FIG. 13. The SEs are deflected by the deflector 106 and collected by the side detector 123. The BSEs have the higher emission energies (the same energy as the landing energy), and they may be collected by both the side detector 123 and the annular detector 109. The BSEs with small polar angles (e.g., less than 10 degrees) may be focused and accelerated to pass through the upper Wehnelt electrode 107 bore, as shown by the rays of BSE-1 in FIG. 13. The BSE-1 electrons can also be collected by the side detector 123 to form bright-field images. The BSEs with large polar angles (e.g., greater than 45 degrees) can be collected by the annular detector 109 to form dark-field images, as shown by the rays of BSE-2 in FIG. 13.

FIG. 14 is an embodiment of an electron beam bender 124. The electron beam bender 124 is disposed between the middle magnetic deflector 122 and the magnetic deflector 106 or other locations proximate the side detector 123. The electron beam bender 124 has two cylindrical surfaces and is configured to filter between the SEs from the BSEs at the side detector 123. Thus, the electron beam bender 124 can be used to filter the SEs from the BSEs or vice versa.

The SEs or BSEs may be bent depending on where the side detector 123 is deployed. For example, in FIG. 14 the beams are bent 90 degrees (approximately 10 degrees from the deflector 106 deflection and the remainder from the electron beam bender 124). The bending voltage can be independent of the bending angle, so any a bending degree can use the same voltage. The bending voltage may depend on the SE/BSE energy and the gap of the electron beam bender 124. The smaller the gap, the lower bending voltage will be. The gap can be in a range from approximately 8 mm to 16 mm. For the low landing energy uses collecting the SEs, the bending voltage may be a couple of kVs.

In FIG. 12, the energy difference between the SE beam and BSE-1 beam is as narrow as hundreds to thousands of electron Volts because of the applications with low landing energies. The SE and the BSE-1 electrons may be collected by the side detector 123 together, polluting one imaging signal to another. With the electron bender 124 of FIG. 14, the SE beam may be filtered out from the BSE-1 beam by a suitable bending voltage Vb. The SE beam is over-deflected by the bender due to lower energies and the BSE-1 electrons are passing through the exit aperture towards the side detector 123. The SEs can also be selected from the BSE-1 beam by using a lower bending voltage Vb to let the BSE-1 be under-deflected and stopped in the electron beam bender 124 cylindrical surface.

In addition to the advantage of filtering the BSEs from SEs (or vice versa), an embodiment with an electron beam bender 124 can create a space between the exit of the electron beam bender 124 and the side detector 123. Either SE or BSE energy filtering may be further conducted by constructing low-pass filter, high-pass filter, or band-filter in the space before directing either the SEs or BSEs towards the side detector 123 such that the defect properties may be more carefully analyzed and learning-cycled.

For 90 degree SE/BSE bending, the side detector 123 can be positioned a certain distance away from the exit of the electron beam bender 124. A signal processing optics may be positioned between the exit of the electron beam bender 124 and the side detector 123. The signal processing optics may be a low-pass energy filter, high-pass energy filter, band-pass energy filter, de-scan deflectors, or other systems for characterizing more detailed wafer defect features. Without the electron beam bender 124 like in FIG. 12, the SE/BSE may not be deflected at a large angle, and the side detector 123 may not be positioned to accommodate the signal processing optics.

The electron beam bender 124 in FIG. 14 can be electrostatic or magnetic. For electron bending in a plane, the magnetic flux can be directed in a perpendicular plane.

Figure 15:
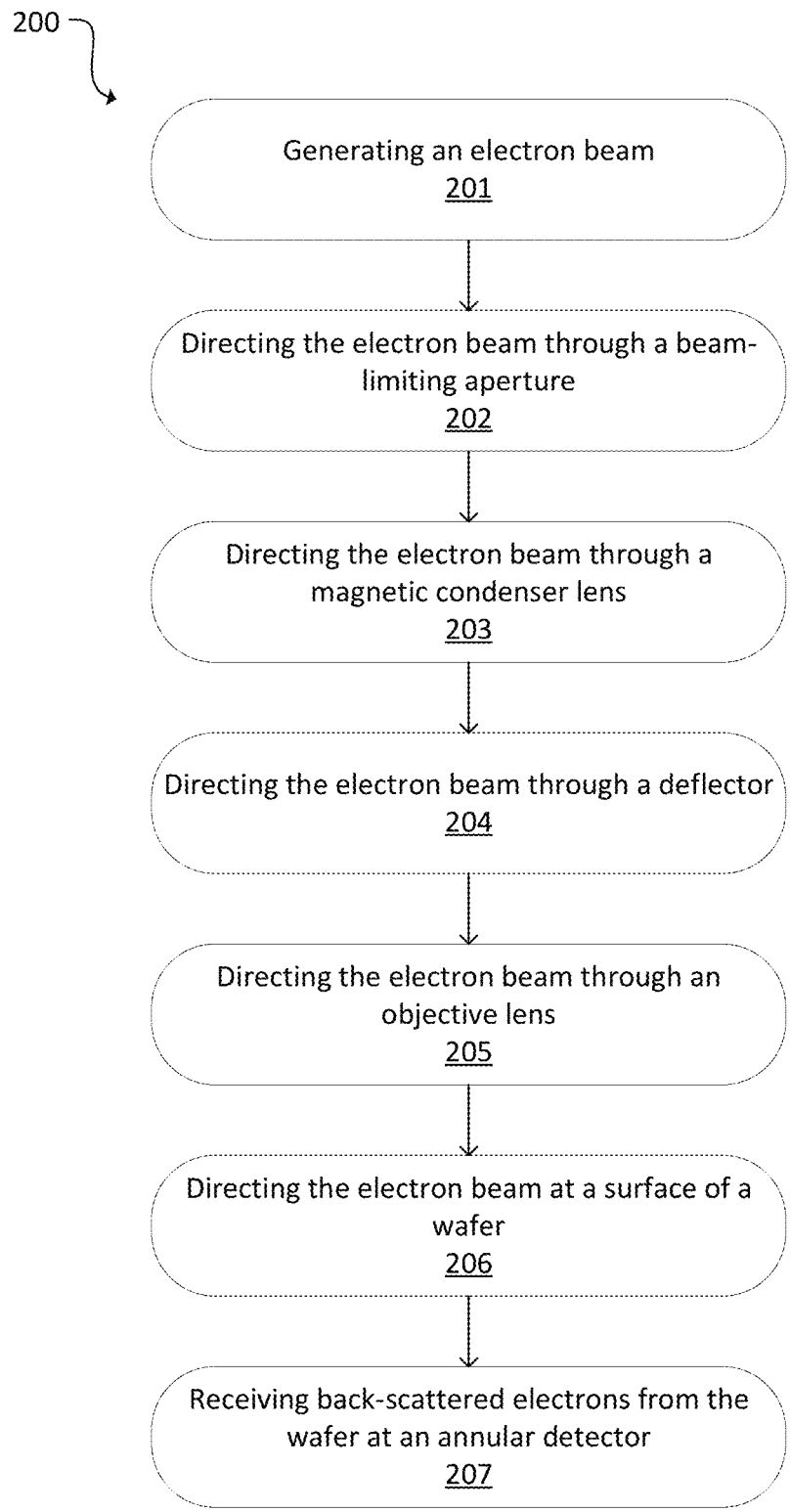
FIG. 15 is a flowchart of a method in accordance with the present disclosure.

FIG. 15 is a flowchart of a method 200. The method 200 can be performed using an embodiment of an electron beam system disclosed herein. An electron beam is generated at 201 and directed through a beam-limiting aperture at 202. A beam voltage of the electron beam can be from 50 kV to 100 kV and can have a landing energy from 50 keV to 100 keV. Selecting the beam energy or landing energy depends on a particular application. The beam energy is normally higher than or equal to the landing energy. For deeper memory holes with more layers of thin films, higher landing energies may be used to obtain higher BSE energies, such that the BSEs are able to penetrate through the thicker stacked thin films and escape from the surface. 50 keV may be for approximately 96 to 124 layers. 100 keV may be for greater than 256 layers.

At 203, the electron beam is directed through a magnetic condenser lens disposed along a path of the electron beam downstream of the beam-limiting aperture. At 204, the electron beam is directed through a deflector disposed along a path of the electron beam downstream of the magnetic condenser lens. The deflector can be a magnetic deflector or a Wien filter. At 205, the electron beam is directed through an objective lens. The objective lens includes a ground tube, an upper Wehnelt electrode, and a lower Wehnelt electrode. At 206, the electron beam is directed from the lower Wehnelt electrode at a surface of a wafer. A depth of focus for the electron beam can be up to 20 μm. The wafer can include a three-dimensional semiconductor structure such as 3D NAND, 3D DRAM, 3D staircase steps, or 3D deep trench logic. At 207, back-scattered electrons from the wafer are received at an annular detector disposed on a surface of the upper Wehnelt electrode that faces the lower Wehnelt electrode.

The magnetic condenser lens can be configured to form the electron beam to have a small depth of focus mode and a large depth of focus mode. A numeric aperture is smaller for the large depth of focus mode than the small depth of focus mode.

In an instance, the deflector is a magnetic deflector. The electron beam also can be directed through an upper magnetic deflector and a middle magnetic deflector disposed along the path of the electron beam between the deflector and the magnetic condenser lens. The upper magnetic deflector can be configured to deflect the electron beam to the middle magnetic deflector. The middle magnetic deflector can be configured to deflect the electron beam toward the magnetic deflector in a direction opposite that of the upper magnetic deflector. The magnetic deflector can be configured to deflect the electron beam and collimate the electron beam along the path into the ground tube.

Secondary electrons can be received at a side detector disposed between the middle magnetic deflector and the magnetic deflector. Electrons returned from the wafer can be bent between the middle magnetic deflector and the magnetic deflector thereby filtering between the secondary electrons from the back scattered electrons at the side detector. Electron beam bending can filter the BSEs out from the SEs (or vice versa), which can remove the electronic pollution from useful signals.

Embodiments of the systems and methods described herein can be used for inspecting and reviewing deep memory holes. For example, operation at 60 kV offers a 20 μm DOF for AR=1:200 uses, which is more than 5× better than previous designs. High BSE collection efficiency can be achieved using an annular detector because high BV and high LE are used and the BSEs are less focused compared to the conventional BSE collection with relatively low LEs. With the advantage of sufficient BSE signals, a relatively low beam current may be used to further reduce Coulomb interactions between electrons and extend DOF longer while simultaneously narrowing the tail of electron distribution.

A Wien-filter-free electron beam can split optics with three magnetic deflectors, which can eliminate transfer chromatic aberrations due to source energy spread and electronic and/or thermal noises when the total net deflection angle being zero.

The upper Wehnelt electrode can be used to boost (i.e., accelerate) the beam energy before retarding to wafer, thereby reducing the spherical and chromatic aberration coefficients of the objective lens. Due to the beam energy boosting, the Coulomb interactions between electrons are reduced simultaneously. This improves resolutions in the uses with low landing energies.

The method 200 can be used for inspections and reviews for 3D devices (e.g., 3D NAND, 3D DRAM, 3D staircase steps, and 3D deep trench logic). The embodiments of FIG. 6 and FIG. 8 offer large DOFs up to 20 microns for inspections and reviews of AR=1:200 3D devices, which can be used to develop hundreds of layers in next generation 3D NAND memories.

For inspecting and reviewing wafer surface or sub-micron-below surface defects with low landing energies in hundreds to thousands of electron Volts, the embodiments disclosed herein can use a Wien-filter-free beam splitting optics with the three magnetic deflectors in FIGS. 9-11 and an energy-boosting upper Wehnelt electrode can reduce spherical and chromatic aberration coefficients of the objective lens (FIGS. 12 and 13). An electron beam bender can filter out the BSEs from SEs or SEs from BSEs (FIG. 14) such that high resolution image-formations and high collection efficiencies of SEs and BSEs may be achieved simultaneously.

While described with respect to an electron beam, the embodiments disclosed herein also can be used with an ion beam or a particle beam.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   an electron beam source that generates an electron beam;
   a beam-limiting aperture disposed in a path of the electron beam;
   a lower Wehnelt electrode disposed in the path of the electron beam;
   an upper Wehnelt electrode disposed in the path of the electron beam between the lower Wehnelt electrode and the beam-limiting aperture;
   an annular detector disposed on a surface of the upper Wehnelt electrode facing the lower Wehnelt electrode;
   a magnetic condenser lens disposed in the path of the electron beam between the upper Wehnelt electrode and the beam-limiting aperture, wherein the magnetic condenser lens includes pole pieces and a condenser lens coil;
   a deflector disposed in the path of the electron beam between the upper Wehnelt electrode and the condenser lens;
   a magnetic objective lens coil disposed in the path of the electron beam between the deflector and the upper Wehnelt electrode; and
   a ground tube disposed in the path of the electron beam, wherein the magnetic objective lens coil is disposed around the ground tube.

2. The system of claim 1, further comprising an aperture disposed in the path of the electron beam between the condenser lens and the beam-limiting aperture.

3. The system of claim 1, wherein the electron beam source includes a tip with a radius less than 1 μm.

4. The system of claim 1, wherein the deflector is a magnetic deflector or a Wien filter.

5. The system of claim 4, wherein the deflector is the magnetic deflector, and further comprising an upper magnetic deflector and a middle magnetic deflector, the upper magnetic deflector disposed in the path of the electron beam between the deflector and the magnetic condenser lens, and the middle magnetic deflector disposed in the path of the electron beam between the upper magnetic deflector and the magnetic deflector.

6. The system of claim 5, wherein the upper magnetic deflector is configured to deflect the electron beam to the middle magnetic deflector, wherein the middle magnetic deflector is configured to deflect the electron beam toward the magnetic deflector in a direction opposite that of the upper magnetic deflector, and wherein the magnetic deflector is configured to deflect the electron beam and collimate the electron beam along the path into the ground tube.

7. The system of claim 5, wherein each of the magnetic deflector, the upper magnetic deflector, and the middle magnetic deflector have eight magnetic pole pieces that are rotationally symmetric.

8. The system of claim 5, further comprising a side detector disposed between the middle magnetic deflector and the magnetic deflector, wherein the side detector is configured to collect at least secondary electrons.

9. The system of claim 8, further comprising an electron beam bender disposed between the middle magnetic deflector and the magnetic deflector, wherein the electron beam bender is configured to filter between the secondary electrons from back scattered electrons at the side detector.

10. A method comprising:
    generating an electron beam with an electron beam source;
    directing the electron beam through a beam-limiting aperture;
    directing the electron beam through a magnetic condenser lens disposed along a path of the electron beam downstream of the beam-limiting aperture;
    directing the electron beam through a deflector disposed along a path of the electron beam downstream of the magnetic condenser lens;
    directing the electron beam through an objective lens, wherein the objective lens includes a ground tube, an upper Wehnelt electrode, and a lower Wehnelt electrode;
    directing the electron beam from the lower Wehnelt electrode at a surface of a wafer; and
    receiving back-scattered electrons from the wafer at an annular detector disposed on a surface of the upper Wehnelt electrode, wherein the surface of the upper Wehnelt electrode faces the lower Wehnelt electrode.

11. The method of claim 10, wherein a beam voltage of the electron beam is from 50 kV to 100 kV and has a landing energy from 50 keV to 100 keV.

12. The method of claim 10, wherein the magnetic condenser lens is configured to form the electron beam to have a small depth of focus mode and a large depth of focus mode, wherein a numeric aperture is smaller for the large depth of focus mode than the small depth of focus mode.

13. The method of claim 10, wherein the wafer includes a three-dimensional semiconductor structure.

14. The method of claim 10, wherein a depth of focus for the electron beam is up to 20 μm.

15. The method of claim 10, wherein the electron beam source includes a tip with a radius less than 1 μm.

16. The method of claim 10, wherein the deflector is a magnetic deflector or a Wien filter.

17. The method of claim 16, wherein the deflector is the magnetic deflector, and further directing the electron beam through an upper magnetic deflector and a middle magnetic deflector disposed along the path of the electron beam between the deflector and the magnetic condenser lens.

18. The method of claim 17, wherein the upper magnetic deflector is configured to deflect the electron beam to the middle magnetic deflector, wherein the middle magnetic deflector is configured to deflect the electron beam toward the magnetic deflector in a direction opposite that of the upper magnetic deflector, and wherein the magnetic deflector is configured to deflect the electron beam and collimate the electron beam along the path into the ground tube.

19. The method of claim 17, further comprising receiving secondary electrons at a side detector disposed between the middle magnetic deflector and the magnetic deflector.

20. The method of claim 19, further comprising bending electrons returned from the wafer between the middle magnetic deflector and the magnetic deflector thereby filtering between the secondary electrons from back scattered electrons at the side detector.

* * * * *